US007300738B2

(12) United States Patent
Saito et al.

(10) Patent No.: US 7,300,738 B2
(45) Date of Patent: Nov. 27, 2007

(54) AZOLINYL ACETIC ACID DERIVATIVE AND AZOLINYL ACETIC ACID DERIVATIVE CONTAINING RECORDING MATERIAL

(75) Inventors: Naoki Saito, Shizuoka-ken (JP); Tetsunori Matsushita, Shizuoka-ken (JP); Akinori Fujita, Shizuoka-ken (JP); Yohsuke Takeuchi, Shizuoka-ken (JP); Satoshi Higuchi, Shizuoka-ken (JP); Kimi Ikeda, Shizuoka-ken (JP)

(73) Assignee: Fujifilm Corporation, Tokyo (JP)

( * ) Notice: Subject to any disclaimer, the term of this patent is extended or adjusted under 35 U.S.C. 154(b) by 543 days.

(21) Appl. No.: 10/773,366

(22) Filed: Feb. 9, 2004

(65) Prior Publication Data

US 2004/0157157 A1 Aug. 12, 2004

(30) Foreign Application Priority Data

Feb. 10, 2003 (JP) ............................ 2003-032490

(51) Int. Cl.
*G03F 7/021* (2006.01)

(52) U.S. Cl. ...................... 430/157; 430/171; 430/182; 548/146

(58) Field of Classification Search ................ 430/157, 430/171, 182; 548/146
See application file for complete search history.

(56) References Cited

U.S. PATENT DOCUMENTS

| | | | | |
|---|---|---|---|---|
| 4,842,979 A * | 6/1989 | Ishige et al. | ................ | 430/138 |
| 5,296,329 A * | 3/1994 | Sugiyama et al. | .......... | 430/138 |
| 6,017,672 A * | 1/2000 | Arai et al. | .................. | 430/138 |

FOREIGN PATENT DOCUMENTS

| | | |
|---|---|---|
| JP | 63-115891 A | 5/1988 |
| JP | 4-135787 A | 5/1992 |
| JP | 4-144784 A | 5/1992 |
| JP | 4-201483 A | 7/1992 |

OTHER PUBLICATIONS

The Merck Index, 11th Ed., Quinazoline 8062, p. 1281.*
Hawley's Condensed Chemical Dictionary, $12^{th}$ Ed., p. 860, oxazole.*
Journal of the Chemical Society, Perkin Transactions I, A journal of organic and bio-organic chemistry, 1987, pp. 1845-1852.

* cited by examiner

*Primary Examiner*—John S. Chu
(74) *Attorney, Agent, or Firm*—Sughrue Mion, PLLC

(57) ABSTRACT

A recording material having, on a support, a recording layer containing an azolinyl acetic acid derivative and a diazo compound. The azolinyl acetic acid derivative is preferably is a compound represented by the following general formula (1):

General formula (1)

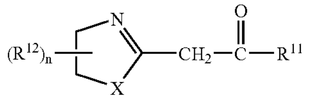

wherein X represents an oxygen atom or a sulfur atom; $R^{11}$ represents an alkyl group, an aryl group, a heterocyclic group, —$OR^{13}$ or —$NR^{14}R^{15}$; $R^{12}$ represents a substituent; $R^{13}$ represents an alkyl group, an aryl group or a heterocyclic group; $R^{14}$ and $R^{15}$ each independently represents a hydrogen atom, an alkyl group, an aryl group or a heterocyclic group; n represents an integer from 0 to 4; and, when n is an integer of 2 or greater, two or more $R^{12}$s may be linked with each other to form a ring.

18 Claims, No Drawings

AZOLINYL ACETIC ACID DERIVATIVE AND AZOLINYL ACETIC ACID DERIVATIVE CONTAINING RECORDING MATERIAL

CROSS-REFERENCE TO RELATED APPLICATION

This application claims priority under 35 U S C 119 from Japanese Patent Application No. 2003-32490, the disclosure of which is incorporated by reference herein.

BACKGROUND OF THE INVENTION

1. Field of the Invention

The present invention relates to a novel azolinyl acetic acid derivative and a recording material using as coupling component a combination of at least one azolinyl acetic acid derivative and a diazo compound. In particular, the invention is concerned with a thermal recording material which has excellent storability before images are recorded thereon (unprocessed stock storability) and high color formation efficiency, is reduced in coloration of a background portion due to exposure to light, and ensures high image stability (light fastness) in a recorded portion.

2. Description of the Related Art

Diazo compounds form azo dyes by reacting with compounds referred to as "couplers", such as phenol derivatives and compounds having active methylene groups. In addition, the diazo compounds have the property of decomposing when irradiated with light and losing their activities. This property of diazo compounds has been long exploited for photo recording materials, typified by diazo copy, as described in a book entitled "Shashin Kogaku no Kiso—Higin-en Shashin Hen—" ("Fundamentals of Photographic Engineering—Nonsilver Salt Photography Book—"), compiled by Nippon Shashin Gakkai (Society of Photographic Science and Technology of Japan), pages 89-117 and 182-201, published by Corona Publishing Co., Ltd. (1982).

In recent years, the diazo compounds have also been applied to recording materials of the type which require fixing images formed therein. Representatives of hitherto proposed recording materials of such a type are light-fixing thermal recording materials in which images are formed by heating diazo compounds and coupler compounds in accordance with image signals and making these compounds react with each other. And the images are fixed by irradiation with light. These recording materials are described in Koji Sato et al., Gazo Denshi Gakkai-shi (Journal of Institute of Image Electronics Engineers of Japan), vol. 11, No. 4, pp. 290-296 (1982).

However, active diazo compounds in such recording materials lose their reactivity even in the dark through gradual decomposition by heat. Therefore, those recording materials have a drawback of being short in shelf life. With the intention of overcoming such a drawback, the method of encapsulating diazo compounds and thereby isolating them from promoters of their decomposition, such as water and bases, was proposed. According to this method, the recording materials can have dramatically improved shelf life. This proposal is described in Tomomasa Usami et al., Gazo Denshi Gakkai-shi (Journal of Institute of Image Electronics Engineers of Japan), vol. 26, No. 2, pp. 115-125 (1987).

On the other hand, the walls of microcapsules having glass transition temperatures higher than room temperature are impervious to substances at room temperature, whereas they become pervious to substances at temperatures higher than glass transition temperatures. Therefore, those microcapsules are thermally responsive ones and suitable for use in thermal recording materials. More specifically, a thermal recording material having a support coated with a thermal recording layer containing thermally responsive microcapsules enclosing a diazo compound, a coupler compound and a base enables (1) improvement in long-term stable storage of the diazo compound, (2) formation of developed color images by heating, and (3) fixation of the images by irradiation with light.

Recent years have seen addition of more functionality, e.g., an ability to form images in multiple colors, to the thermal recording materials as recited above. In keeping with the recent trend toward more functionality, there are growing needs for property enhancements of the recording materials, including enhancement of unprocessed stock storability the recording materials have before recording and enhancement of light fastness the recording materials have in image and non-image portions after recording. These circumstances are described in JP-A-4-135787 and JP-A-4-144784.

Further, JP-A-4-201483 proposes the method of using an acetoacetoanilide compound as a coupler for forming a yellow image. However, the thermal recording material adopting such a method has a drawback of being insufficient in the properties mentioned above.

On the other hand, azolinyl acetic acid derivatives as described in JP-A-63-115891 and J. Chem. Soc. Perkin Trans. 1, pp. 1845-1852 (1987) have never been examined on their suitability as couplers used in the thermal recording materials.

SUMMARY OF THE INVENTION

The invention provides a recording material which has excellent storability before images are recorded thereon (unprocessed stock storability) and high color formation efficiency, is reduced in coloration of a background portion due to exposure to light, and ensures high image stability (light fastness) in a recorded portion.

Moreover, the invention provides a novel azolinyl acetic acid derivative which can ensure excellent properties as described above for a recording material.

A first aspect of the present invention is to provide a recording material comprising, on a support, a recording layer containing a diazo compound and an azolinyl acetic acid derivative as a coupler which reacts with the diazo compound to form a color.

A second aspect of the present invention is to provide an azolinyl acetic acid derivative represented by the following general formula (1a):

General formula (1a)

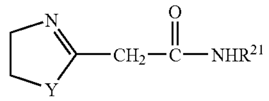

wherein Y represents an oxygen atom or a sulfur atom; and $R^{21}$ represents an alkyl group or an aryl group.

DETAILED DESCRIPTION OF THE INVENTION

The recording material of the present invention has on a support a recording layer containing an azolinyl acetic acid derivative and a diazo compound. It is a preferred embodiment of the invention that the azolinyl acetic acid derivative contained in the recording material is a compound represented by the following general formula (1).

And an azolinyl acetic acid derivative according to the invention is represented by the following general formula (1a). The azolinyl acetic acid derivative represented by the general formula (1a) is conceptually subordinate to the compound represented by the general formula (1).

The azolinyl acetic acid derivative according to the invention is described below, and then the recording material of the invention is described.

General formula (1)

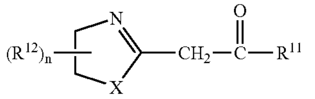

In the general formula (1), X represents an oxygen atom or a sulfur atom; $R^{11}$ represents an alkyl group, an aryl group, a heterocyclic group, —$OR^{13}$ or —$NR^{14}R^{15}$; $R^{12}$ represents a substituent; $R^{13}$ represents an alkyl group, an aryl group or a heterocyclic group; $R^{14}$ and $R^{15}$ each independently represents a hydrogen atom, an alkyl group, an aryl group or a heterocyclic group; and n represents an integer from 0 to 4. Herein, when n is an integer of 2 or greater, two or more $R^{12}$s may be linked with each other to form a ring.

General formula (1a)

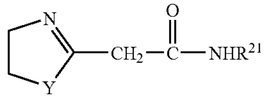

In the general formula (1a), Y represents an oxygen atom or a sulfur atom, and $R^{21}$ represents an alkyl group or an aryl group.

<<Azolinyl Acetic Acid Derivative of the Invention>>

As mentioned above, the azolinyl acetic acid derivative of the invention is represented by the aforementioned general formula (1a). The azolinyl acetic acid derivative of the invention can be used as a coupler for forming a developed-color image in a sensitive material for photo shooting or printing, or as a precursor for producing various dyes. The azolinyl acetic acid derivative of the invention is used suitably for forming an azo dye by reacting with a diazo compound in particular.

In the general formula (1a), Y represents —O— (oxygen atom) or —S— (sulfur atom), preferably —S— (sulfur atom).

And $R^{21}$ in the general formula (1a) represents an alkyl group or an aryl group.

The alkyl group suitable as $R^{21}$ is a straight chain or cyclic alkyl group having 1 to 20 carbon atoms, preferably a straight chain or cyclic alkyl group having 1 to 16 carbon atoms, particularly preferably a straight chain or cyclic alkyl group having 1 to 12 carbon atoms. Suitable examples of such an alkyl group include methyl, ethyl, n-propyl, isopropyl, n-butyl, isobutyl, s-butyl, n-amyl, 1-ethylpropyl, isoamyl, neopentyl, n-hexyl, cyclohexyl, n-heptyl, cyclohexylmethyl, n-octyl, 2-ethylhexyl, n-decyl and n-dodecyl. Of these groups, methyl, ethyl, n-propyl, n-butyl, n-hexyl, cyclohexyl and n-dodecyl are preferred over the others.

The aryl group suitable as $R^{21}$ is phenyl, naphthyl, anthracenyl or phenanthrenyl. Of these aryl groups, phenyl and naphthyl are preferred over the others and of these aryl groups and phenyl are more preferred over the others.

The groups the $R^{21}$ can represent may further have substituents. Suitable examples of such substituents include alkyl groups having 1 to 20 carbon atoms, aryl groups having 6 to 14 carbon atoms, heterocyclic groups having 1 to 10 carbon atoms, halogen atoms, alkoxy groups having 1 to 20 carbon atoms, sulfenyl groups, aryloxy groups having 6 to 14 carbon atoms, acyl groups having 2 to 21 carbon atoms, alkylsulfonyl groups having 1 to 20 carbon atoms, arylsulfonyl groups having 6 to 14 carbon atoms, acyloxy groups having 2 to 21 carbon atoms, acylamino groups having 2 to 21 carbon atoms, alkoxycarbonyl groups having 2 to 21 carbon atoms, aryloxycarbonyl groups having 7 to 15 carbon atoms, carbamoyl groups having 1 to 21 carbon atoms, sulfamoyl groups having 0 to 20 carbon atoms, a hydroxyl group, a cyano group, a carboxyl group, a sulfo group and a nitro group.

Of these groups, alkyl groups having 1 to 16 carbon atoms, aryl groups having 6 to 10 carbon atoms, heterocyclic groups having 2 to 8 carbon atoms, halogen atoms, alkoxy groups having 1 to 16 carbon atoms, sulfenyl groups having 1 to 16 carbon atoms, aryloxy groups having 6 to 10 carbon atoms, acyl groups having 2 to 17 carbon atoms, alkylsulfonyl groups having 1 to 16 carbon atoms, arylsulfonyl groups having 6 to 10 carbon atoms, acyloxy groups having 2 to 17 carbon atoms, acylamino groups having 2 to 17 carbon atoms, alkoxycarbonyl groups having 2 to 17 carbon atoms, aryloxycarbonyl groups having 7 to 11 carbon atoms, carbamoyl groups having 1 to 17 carbon atoms, sulfamoyl group having 0 to 16 carbon atoms, a hydroxyl group and a cyano groups are preferred as the substituents.

Among the substituents recited above, especially preferred ones are alkyl groups having 1 to 12 carbon atoms, a phenyl group, a chlorine atom, alkoxy groups having 1 to 12 carbon atoms, sulfenyl groups having 1 to 12 carbon atoms, acyl groups having 2 to 13 carbon atoms, alkylsulfonyl groups having 1 to 12 carbon atoms, acyloxy groups having 2 to 13 carbon atoms, acylamino groups having 2 to 13 carbon atoms, a phenylsulfonyl group, alkoxycarbonyl group having 2 to 13 carbon atoms, carbamoyl groups having 1 to 13 carbon atoms and sulfamoyl groups having 0 to 12 carbon atoms.

The azolinyl acetic acid derivative of the invention can be prepared from properly chosen compounds in accordance with the same method as adopted for preparation of a compound represented by the general formula (1), which is described hereinafter.

Examples of the azolinyl acetic acid derivative of the invention include the compounds recited as examples of a compound represented by the general formula (1) described hereinafter; specifically (A-1), (A-2), (A-4), (A-6), (A-7), (A-13) to (A-19), (A-21) to (A-25) and (A-28) to (A-33). However, these compounds should not be construed as limiting the scope of the invention.

<<Recording Material>>

In the next place, the recording material of the invention is described below.

The recording material of the invention has on a support at least one recording layer containing a diazo compound and an azolinyl acetic acid derivative as a coupler forming a color by reacting with the diazo compound. As to the method of forming colors, the recording material of the invention may be a thermal recording material having a thermal recording layer capable of forming a color by heat, or a pressure-sensitive recording material having a pressure-sensitive recording layer capable of forming a color by pressure, or a photo-thermal sensitive recording material capable of forming a latent image by light and converting it to a developed color image by heat. Now, the recording material of the invention will be described taking the case of a recording material having a thermal recording layer (thermal recording material). However, the invention should not be construed as being limited to this case.

<Recording Layer>

The recording layer (thermal recording layer) in the invention contains at least an azolinyl acetic acid derivative and a diazo compound. The diazo compound is preferably encapsulated in microcapsule. Further, the thermal recording layer may contain various additives, such as an organic base and a color forming auxiliary, if needed.

(Coupler)

In the recording layer according to the invention, an azolinyl acetic acid derivative is contained as a coupler. The azolinyl acetic acid derivative usable in the invention has no particular restriction. From the viewpoints of the developed color hue, the color formation efficiency and the image fastness, it is preferable that the azolinyl acetic acid derivative be a compound represented by the following general formula (1):

General formula (1)

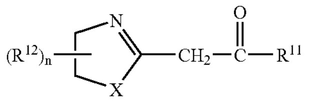

In the general formula (1), X represents an oxygen atom or a sulfur atom; $R^{11}$ represents an alkyl group, an aryl group, a heterocyclic group, —$OR^{13}$ or —$NR^{14}R^{15}$; $R^{12}$ represents a substituent; $R^{13}$ represents an alkyl group, an aryl group or a heterocyclic group; $R^{14}$ and $R^{15}$ each independently represents a hydrogen atom, an alkyl group, an aryl group or a heterocyclic group; and n represents an integer from 0 to 4. When n is an integer of 2 or greater, two or more $R^{12}$s may be linked with each other to form a ring.

The alkyl group suitable as $R^{11}$, $R^{13}$, $R^{14}$ and $R^{15}$ each in the general formula (1) is a straight chain or cyclic alkyl group having 1 to 20 carbon atoms, preferably a straight chain or cyclic alkyl group having 1 to 16 carbon atoms, particularly preferably a straight chain or cyclic alkyl group having 1 to 12 carbon atoms. Suitable examples of such an alkyl group include methyl, ethyl, n-propyl, isopropyl, n-butyl, isobutyl, s-butyl, n-amyl, 1-ethylpropyl, isoamyl, neopentyl, n-hexyl, cyclohexyl, n-heptyl, cyclohexylmethyl, n-octyl, 2-ethylhexyl, n-decyl and n-dodecyl. Of these groups, methyl, ethyl, n-propyl, n-butyl, n-hexyl, cyclohexyl and n-dodecyl are preferred over the others.

In the general formula (1), the aryl group suitable as $R^{11}$, $R^{13}$, $R^{14}$ and $R^{15}$ each is phenyl, naphthyl, anthracenyl or phenanthrenyl, preferably phenyl or naphthyl, especially phenyl.

In the general formula (1), the hetero atom or atoms contained in a heterocyclic group represented by $R^{11}$, $R^{13}$, $R^{14}$ and $R^{15}$ each is preferably nitrogen, oxygen, sulfur, selenium, tellurium and phosphorus atoms, still more preferably nitrogen, oxygen and sulfur atoms, particularly preferably nitrogen and oxygen atoms. The heterocyclic group suitable as $R^{11}$, $R^{13}$, $R^{14}$ and $R^{15}$ each is a saturated or unsaturated heterocyclic group having 1 to 10 carbon atoms, preferably a saturated or unsaturated heterocyclic group having 2 to 8 carbon atoms, particularly preferably a unsaturated heterocyclic group having 2 to 7 carbon atoms.

Suitable examples of such heterocyclic groups include 2-pyridyl, 3-pyridyl, 4-pyridyl, 3-pyridazinyl, 2-pyrimidinyl, 4-pyrimidinyl, 2-pyrazinyl, s-triazinyl, 2-indolyl, 3-indolyl, 2-quinolinyl, 1-isoquinolinyl, 2-furanyl, 2-pyrrolyl, 3-pyrazolyl, 2-imidazolyl, 2-oxazolyl, 2-thiazolyl, 1,2,4-triazole-3-yl, 2-benzimidazolyl, 2-benzoxazolyl and 2-benzothiazolyl. Of these groups, 2-pyridyl, 3-pyridyl, 4-pyridyl, 2-pyrazinyl, 2-furanyl, 2-oxazolyl and 2-thiazolyl are preferred over the others.

Suitable examples of a substituent represented by $R^{12}$ in the general formula (1) include alkyl groups having 1 to 20 carbon atoms, aryl groups having 6 to 14 carbon atoms, heterocyclic groups having 1 to 10 carbon atoms, halogen atoms, alkoxy groups having 1 to 20 carbon atoms, sulphenyl groups having 1 to 20 carbon atoms, aryloxy groups having 6 to 14 carbon atoms, acyl groups having 2 to 21 carbon atoms, alkylsulfonyl groups having 1 to 20 carbon atoms, arylsulfonyl groups having 6 to 14 carbon atoms, acyloxy groups having 2 to 21 carbon atoms, acylamino groups having 2 to 21 carbon atoms, alkoxycarbonyl groups having 2 to 21 carbon atoms, aryloxycarbonyl groups having 7 to 15 carbon atoms, carbamoyl groups having 1 to 21 carbon atoms, sulfamoyl groups having 0 to 20 carbon atoms, a hydroxyl group, a cyano group, a carboxyl group, a sulfo group and a nitro group. Of these substituents, alkyl groups having 1 to 16 carbon atoms, aryl groups having 6 to 10 carbon atoms, heterocyclic groups having 2 to 8 carbon atoms, halogen atoms, alkoxy groups having 1 to 16 carbon atoms, sulphenyl groups having 1 to 16 carbon atoms, aryloxy groups having 6 to 10 carbon atoms, acyl group having 2 to 17 carbon atoms, alkylsulfonyl groups having 1 to 16 carbon atoms, arylsulfonyl groups having 6 to 10 carbon atoms, acyloxy groups having 2 to 17 carbon atoms, acylamino groups having 2 to 17 carbon atoms, alkoxycarbonyl groups having 2 to 17 carbon atoms, aryloxycarbonyl groups having 7 to 11 carbon atoms, carbamoyl groups having 1 to 17 carbon atoms, sulfamoyl groups having 0 to 16 carbon atoms, a hydroxyl group and a cyano group are preferred over the others. In particular, alkyl groups, phenyl, chlorine having 1 to 12 carbon atoms, alkoxy groups having 1 to 12 carbon atoms, sulphenyl groups having 1 to 12 carbon atoms, acyl groups having 2 to 13 carbon atoms, alkylsulfonyl groups having 1 to 12 carbon atoms, acyloxy groups having 2 to 13 carbon atoms, acylamino groups having 2 to 13 carbon atoms, a phenylsulfonyl group, alkoxycarbonyl groups having 2 to 13 carbon atoms, carbamoyl groups having 1 to 13 carbon atoms and sulfamoyl groups having 0 to 12 carbon atoms are favorable.

In the general formula (1), $R^{11}$, $R^{12}$, $R^{13}$, $R^{14}$ and $R^{15}$ each may have a substituent. Suitable examples of such a substituent include those recited above as $R^{12}$.

In the general formula (1), n is preferably an integer from 0 to 2, still more preferably 0 or 1, particularly preferably 0. When n is an integer of 2 or greater, two or more $R^{12}$s may be linked with each other to form a ring. The number of member atoms of the ring formed by combining two or more $R^{12}$s is preferably from 5 to 8, still more preferably from 5 to 7, particularly preferably 5 or 6. Examples of the ring formed by combining two or more $R^{12}$s include a cyclohexane ring, a cyclopentane ring, a dioxane ring, a dioxolan ring and a morpholine ring.

As mentioned above, it is particularly preferred that the compounds represented by the general formula (1) are compounds represented by the aforementioned general formula (1a).

Examples of an azolinyl acetic acid derivative used in the recording material of the invention (Compounds (A-1) to (A-40)) are described below. However, these compounds should not be construed as limiting the scope of the invention.

(A-1)

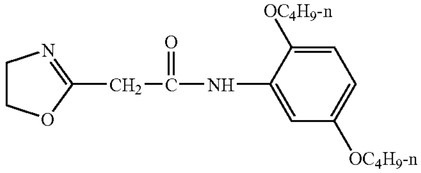

(A-2)

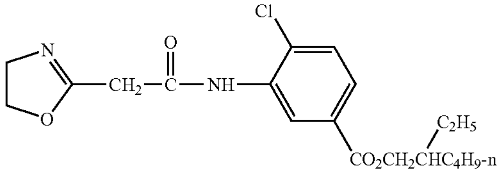

(A-3)

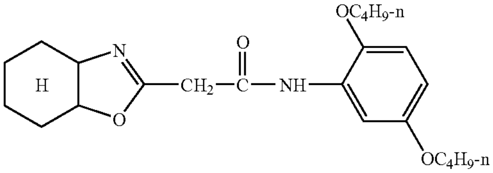

(A-4)

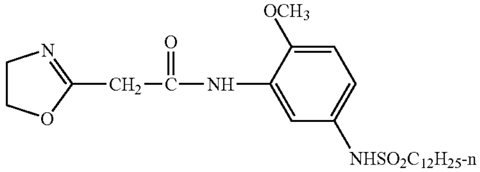

(A-5)

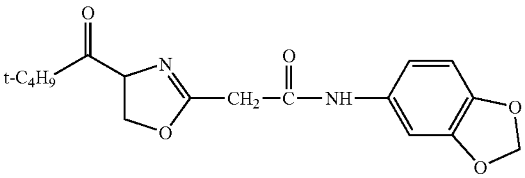

(A-6)

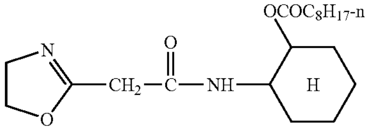

(A-7)

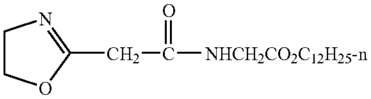

-continued (A-8)

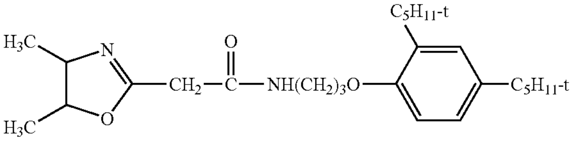

(A-9)

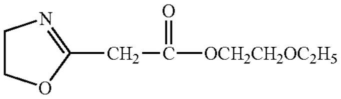

(A-10)

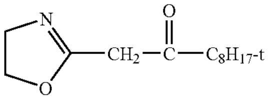

(A-11)

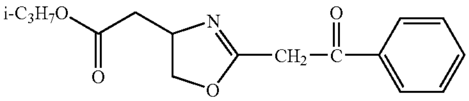

(A-12)

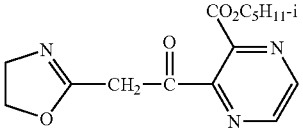

(A-13)

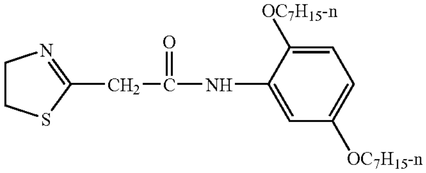

(A-14)

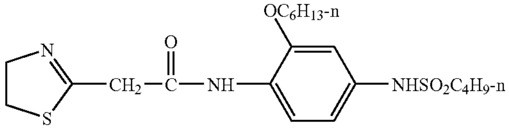

(A-15)

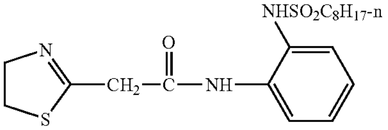

(A-16)

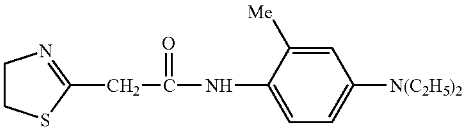

(A-17)

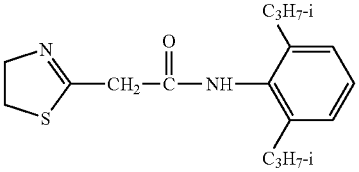

-continued
(A-18)
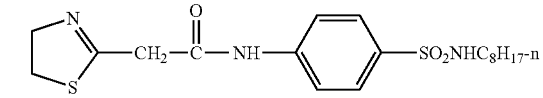
(A-19)
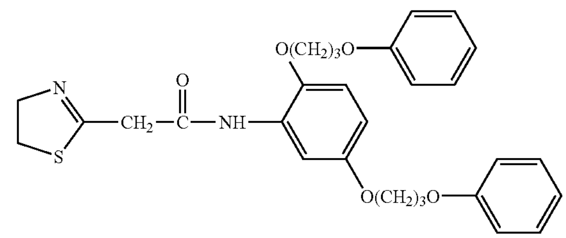
(A-20)
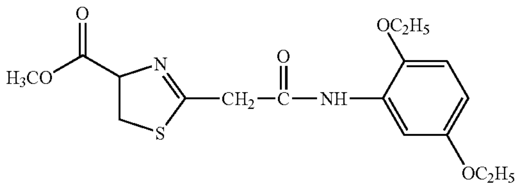
(A-21)
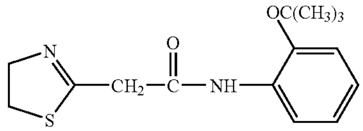
(A-22)
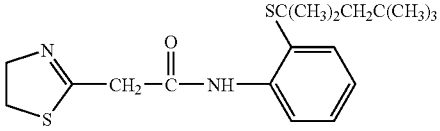
(A-23)
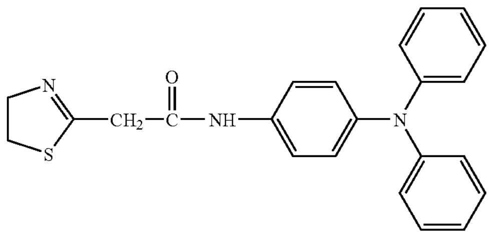
(A-24)
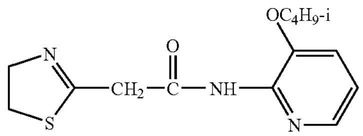
(A-25)
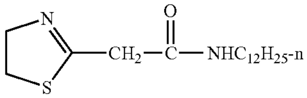
(A-26)
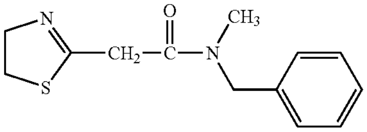
-continued
(A-27)
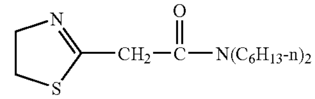
(A-28)
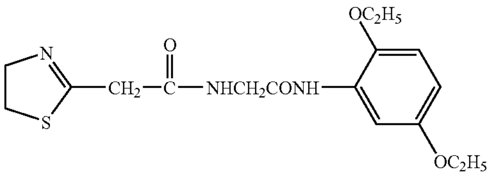
(A-29)
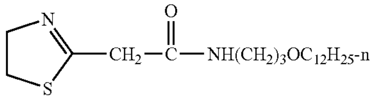
(A-30)
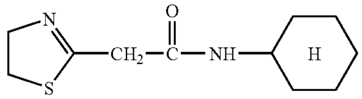
(A-31)
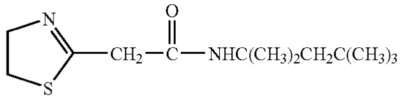
(A-32)
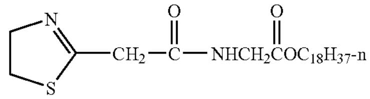
(A-33)
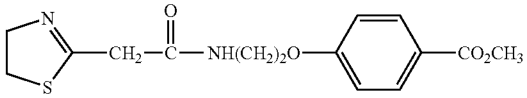
(A-34)
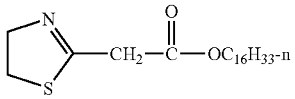
(A-35)
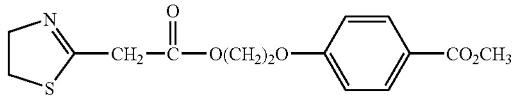
(A-36)
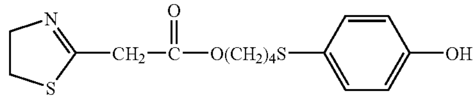
(A-37)
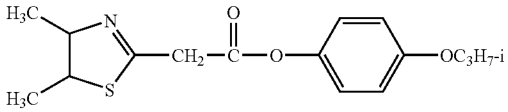
(A-38)
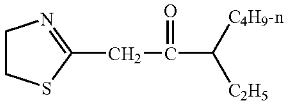

-continued (A-39)

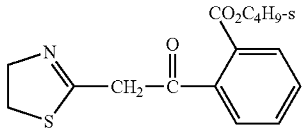

(A-40)

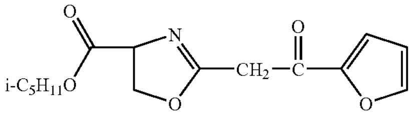

The azolinyl acetic acid derivatives represented by the general formula (1) or (1a) can be synthesized through the following reaction path. In the case of synthesizing a compound containing an oxygen atom as X in the general formula (1), it is advantageous from a viewpoint of yield that an imidate is used as a raw material. On the other hand, in the case of synthesizing a compound containing a sulfur atom as X, on the other hand, the intended compound can be synthesized in a high yield by using selected one from group of an imidate and a cyano compound as a raw material. However, it is advantageous from a viewpoint of availability to use a cyano compound.

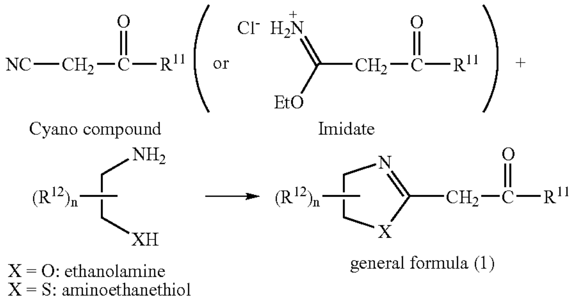

For a synthesis method using a cyano compound as a starting material, example of a preferable reaction solvent includes: alcohols such as methanol, ethanol, isopropanol, n-butanol, t-butanol and ethylene glycol; ethers such as diethyl ether, dibutyl ether and tetrahydrofuran; and hydrocarbons such as benzene, toluene, xylene and cyclohexane. Among them, alcohols are preferable, and ethanol and t-butanol are particularly preferable. Reaction temperature preferably ranges from room temperature (approximately 20° C.) to 150° C., more preferably from 50 to 120° C., and particularly preferably from 70 to 100° C. Reaction time preferably ranges from 1 to 5 hours, more preferably from 2 to 4 hours and particularly preferably from 2.5 to 3 hours.

For a synthesis method using imidate as a starting material, examples of a preferable reaction solvent includes: halogenated hydrocarbons such as chloroform, dichloromethane and dichloroethane; ethers such as diethyl ether, dibutyl ether and tetrahydrofuran; and acetic esters such as methylacetate, ethyl acetate and butyl acetate. Among them, halogenated hydrocarbons are preferable, and chloroform and dichloromethane are particularly preferable. Reaction temperature preferably ranges from −10 to 80° C., more preferably from −5 to 60° C., and particularly preferably from 0 to 50° C. Reaction time preferably ranges from 0.5 to 5 hours, more preferably from 1 to 3 hours, and particularly preferably from 1.5 to 2.5 hours.

In either of the synthesis methods using cyano compound or imidate as a starting material, an amount of the solvent preferably ranges from 3 to 30 times by weight, more preferably from 4 to 20 times by weight, and particularly preferably from 5 to 10 times by weight of the starting material. An amount of ethanolamine or aminoethanethiol to be used preferably ranges from 0.8 to 2.0 times by mole, more preferably from 0.9 to 1.5 times by mole, and particularly preferably from 1.0 to 1.2 times by mole of the starting material.

The total amount of couplers, including the azolinyl acetic acid derivatives, contained in the present recording layer is preferably from 0.2 to 8 moles, still more preferably from 0.5 to 4 moles, per 1 mole of diazo compound. The total coupler content ranging from 0.2 to 8 moles per 1 mole of diazo compound can ensure satisfactory color formation and excellent coating suitability.

In the invention, known couplers forming dyes by coupling with diazo compounds in a basic atmosphere can be used in combination with the azolinyl acetic acid derivatives described above, if needed for adjustment of color hues. In the case of using the azolinyl acetic acid derivatives in combination with known couplers, it is appropriate that the azolinyl acetic acid derivatives constitute at least 50% by mass, preferably at least 70% by mass, of the total couplers contained in the recording layer.

As known couplers usable for the aforementioned purpose, the so-called active methylene compounds which each has a methylene group adjacent to a carbonyl group, phenol derivatives and naphthol derivatives can be recited.

Examples of known couplers usable in the invention include resorcinol, phloroglucinol, sodium 2,3-dihydroxynaphthaltene-6-sulfonate, 1-hydroxy-2-naphthoic acid morpholinopropylaniide, 1,5-dihydroxynaphthalene, 2,3-dihydroxynaphthalene, 2,3-dihydroxy-6-sulfo-naphthalene, 2-hydroxy-3-naphthoic acid morpholinopropylamide, 2-hydroxy-3-naphtholic acid octylamide, 2-hydroxy-3-naphthoic acid anilide, benzoylacetanilide, 1-phenyl-3-methyl-5-pyrazolone, 1-(2,4,6-trichlorophenyl)-3-anilino-5-pyrazolone, 2-{3-[α-(2,4-di-tert-amylphenoxy)-butanamide] benzamide}phenol, 2,4-bis-(benzoylacetamino)toluene and 1,3-bis-(pivaroylacetaminomehyl)benzene.

(Diazonium Compound)

The diazo compounds used in the recording layer have no particular restriction, but it is preferable to use diazonium salts represented by the following general formula (2).

General formula (2)

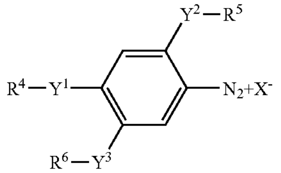

In the general formula (2), $R^4$ and $R^6$ each independently represents an alkyl group, an aryl group, a heterocyclic group or an acyl group, or $R^4$ and $R^6$ may be linked with each other to form a ring; $R^5$ represents an alkyl group, an aryl group, an alkylsulfonyl group, an arylsulfonyl group, an acyl group or a heterocyclic group; $Y^1$ represents an oxygen atom, a sulfur atom or an amino group; $Y^2$ represents an oxygen atom, a sulfur atom or a single bond; $Y^3$ represents an oxygen atom, a sulfur atom, or a hydrogen atom provided that when $Y^3$ is a hydrogen atom, $R^6$ is not present; and $X^-$ represents an anion.

Each of $R^4$ and $R^6$ in the general formula (2) is preferably a alkyl group having 1 to 30 carbon atoms, a aryl group having 6 to 30 carbon atoms or a acyl group having 2 to 20 carbon atoms.

Further, the alkyl group represented by $R^4$ and $R^6$ each may have a substituent. Suitable examples of such a substituent include a phenyl group, a halogen atom, an alkoxy group, an aryloxy group, an alkoxycarbonyl group, an acyloxy group, an acylamino group, a carbamoyl group, a cyano group, a carboxylic acid group, a sulfonic acid group and a heterocyclic group.

Examples of an alkyl group especially suitable as $R^4$ and $R^6$ each includes a methyl group, an ethyl group, a normal propyl group, an isopropyl group, a normal butyl group, an isobutyl group, a pentyl group, a 3-pentyl group, a cyclopentyl group, a hexyl group, a cyclohexyl group, a heptyl group, an octyl group, a 2-ethylhexyl group, a decyl group, a dodecyl group, an octadecyl group, a 2-hydroxyethyl group, a 2-benzoyloxyethyl group, a 2-(4-butoxyphenoxy) ethyl group, a benzyl group, an aryl group, a methoxyethyl group, an ethoxyethyl group and a dibutylaminocarbonylmethyl group.

The aryl group represented by $R^4$ and $R^6$ each may further have a substituent. Suitable examples of such a substituent include a phenyl group, a halogen atom, an alkoxy group, an aryloxy group, an alkoxycarbonyl group, an acyloxy group, an acylamino group, a carbamoyl group, an cyano group, a carboxylic acid group, a sulfonic acid group and a heterocyclic group.

Examples of an aryl group especially suitable as $R^4$ and $R^6$ each includes a phenyl group, a 4-methoxyphenyl group, a 4-chlorophenyl group, a 4-methylphenyl group a 4-butoxyphenyl group and a naphthyl group.

When $R^4$ or $R^6$ represents a heterocyclic group, the heterocycle thereof preferably contains a nitrogen atom, an oxygen atom or a sulfur atom as a hetero atom. And the heterocylic group may be saturated or unsaturated, and may be monocyclic or condensed ring. Examples of the heterocyclic group include furyl, thienyl, oxazolyl, thiazolyl, imidazolyl, pyrazolyl, pyridyl, pyrimidyl, morpholinyl, piperazinyl, indolyl and isoindolyl. Further, these heterocyclic groups may have substituents. Examples of such substituents include the same ones as the aforementioned alkyl groups may have.

The acyl group represented by $R^4$ or $R^6$ may be any of aliphatic, aromatic and heterocyclic ones. Further, the acyl group may have a substituent. Suitable examples of such a substituent include alkoxy groups, aryloxy groups and halogen atoms.

As the acyl group represented by $R^4$ and $R^6$ each, an acetyl group, a propanoyl group, a hexanoyl group or a benzoyl group is particularly preferred.

In addition, $R^4$ and $R^6$ may be linked with each other to form a ring. Examples of the ring formed by combining $R^4$ and $R^6$ include a thiazole ring, an oxazole ring and imidazole ring. These rings may have substituents. Examples of such substituents include the same ones as the aforementioned alkyl groups may have.

$R^5$ in the general formula (2) is preferably a alkyl group having 1 to 20 carbon atoms, a aryl group having 6 to 20 carbon atoms or a acyl group having 2 to 20 carbon atoms.

Examples of an alkyl group, an aryl group, a heterocyclic group or an acyl group represented by $R^5$ include the same groups as the alkyl, the aryl, the heterocyclic or the acyl group represented by $R^4$ and $R^6$ each includes as their respective examples.

The alkylsulfonyl group represented by $R^5$ may further have a substituent. Suitable examples of such a substituent include a phenyl group, a halogen atom, an alkoxy group, an aryloxy group, an alkoxycarbonyl group, an acyloxy group, an acylamino group, a carbamoyl group, a cyano group, a carboxylic acid group, a sulfonic acid group and a heterocyclic group.

Examples of the alkylsulfonyl group as $R^5$ include a methylsulfonyl group, an ethylsulfonyl group, a butylsulfonyl group, a hexylsulfonyl group, a decylsulfonyl group, a benzylsulfonyl group and a methoxybutylsulfonyl group.

The arylsulfonyl group represented by $R^5$ may further have a substituent. Suitable examples of such a substituent include a phenyl group, a halogen atom, an alkoxy group, an aryloxy group, an alkoxycarbonyl group, an acyloxy group, an acylamino group, a carbamoyl group, a cyano group, a carboxylic acid group, a sulfonic acid group and a heterocyclic group.

Of arylsulfonyl groups $R^5$ can represent, a phenylsulfonyl group, a naphthylsulfonyl group, a 4-chlorophenylsulfonyl group and a 4-methylphenylsulfonyl group deserve mention.

$Y^1$ in the general formula (2) is preferably a sulfur atom or an amino group. When $Y^1$ is an amino group, the amino group may have a substituent. Examples of such a substituent include an alkyl group and an aryl group.

In addition, $Y^1$ and $R^4$ may form a cyclic group. Examples of the cyclic group formed of $Y^1$ and $R^4$ include a pyrrolidinyl group, a piperidinyl group, a piperazinyl group and an indolyl group. Further, these groups may have substituents. Examples of such substituents include the same ones as the aforementioned alkyl groups may have.

$Y^2$ in the general formula (2) is preferably a sulfur atom or an oxygen atom. Similarly, $Y^3$ in general formula (2) is preferably a sulfur atom or an oxygen atom.

The anion represented by $X^-$ in the general formula (2) includes both inorganic and organic anions. As the inorganic anion, hexafluorophosphoric acid ion, hydroborofluoric acid ion, chloride ion and sulfuric acid ion are suitable. Of these ions, hexafluorophosphoric acid ion and hydroborofluoric acid ion are preferred over the others. As the organic anion, a polyfluoroalkylcarboxylic acid ion, a polyfluoroalkylsulfonic acid ion, a tetraphenylboric acid ion, an aromatic carboxylic acid ion and an aromatic sulfonic acid ion are particularly suitable.

It is preferable that the diazonium salts represented by the general formula (2) are diazonium salts represented by the following general formula (3) or (4):

General formula (3)

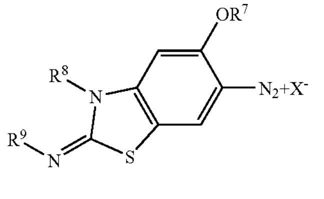

(wherein $R^7$ and $R^8$ each independently represents an alkyl group or an aryl group, $R^9$ represents a hydrogen atom, an alkyl group or an aryl group, and $X^-$ represents an anion)

General formula (4)

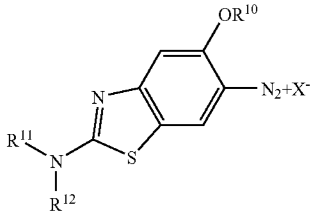

(wherein $R^{10}$, $R^{11}$ and $R^{12}$ each independently represents an alkyl group or an aryl group, or $R^{11}$ and $R^{12}$ may be linked with each other to form a ring; and $X^-$ represents an anion).

As each of $R^7$, $R^8$ and $R^9$ in the general formula (3), a alkyl group having 1 to 20 carbon atoms or a aryl group having 6 to 30 carbon atoms is suitable.

Further, the alkyl groups represented by $R^7$, $R^8$ and $R^9$ may have substituents. Suitable examples of such substituents include a phenyl group, a halogen atom, an alkoxy group, an aryloxy group, an alkoxycarbonyl group, an acyloxy group, an acylamino group, a carbamoyl group, a cyano group, a carboxylic acid group, a sulfonic acid group and a heterocyclic group.

Of the alkyl groups represented by $R^7$, $R^8$ and $R^9$, those especially preferred are a methyl group, an ethyl group, a normal propyl group, an isopropyl group, a normal butyl group, an isobutyl group, a pentyl group, a cyclopentyl group, a hexyl group, a cyclohexyl group, a heptyl group, an octyl group, a 2-ethylhexyl group, a decyl group, a dodecyl group, an octadecyl group, a 2-hydroxyethyl group, a 2-benzoyloxyethyl group, a 2-(4-butoxyphenoxy)ethyl group, a benzyl group, an allyl group, a methoxyethyl group, an ethoxyethyl group and a dibutylaminocarbonylmethyl group.

The aryl groups represented by $R^7$, $R^8$ and $R^9$ in the general formula (3) may have substituents. Suitable examples of such substituents include a phenyl group, a halogen atom, an alkoxy group, an aryloxy group, an alkoxycarbonyl group, an acyloxy group, an acylamino group, a carbamoyl group, a cyano group, a carboxylic acid group, a sulfonic acid group and a heterocyclic group.

As the aryl group represented by $R^7$, $R^8$ and $R^9$ each, a phenyl group, a 4-chlorophenyl group, a 4-methylphenyl group or a 4-butoxyphenyl group is especially preferred.

$X^-$ in the general formula (3) is the same meaning as $X^-$ in the general formula (2), and it has suitable examples thereof include the same ones.

Suitable examples of alkyl and aryl groups which $R^{10}$, $R^{11}$ and $R^{12}$ each can represent in the general formula (4) and suitable examples of $X^-$ in the general formula (4) include the same ones as those which $R^7$, $R^8$ and $R^9$ each can represents in the general formula (3) and those of $X^-$ in the general formula (3), respectively. In addition, $R^{11}$ and $R^{12}$ may be linked with each other to form a ring. Examples of the ring formed by combining $R^{11}$ and $R^{12}$ include a morpholine ring, a piperidine ring and a pyrrolidine ring.

Examples of diazonium salt compounds represented by the general formulae (2) to (4) (Compounds (D-1) to (D-92)) are described below. However, these compounds should not be construed as limiting the scope of the invention. Example of Diazonium compound represented by the general formula (2):

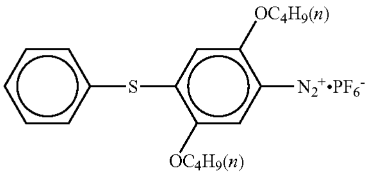
D-1

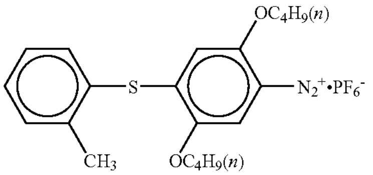
D-2

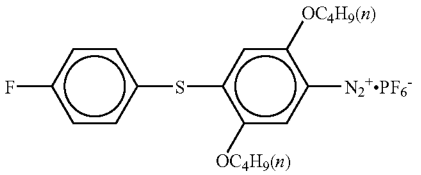
D-3

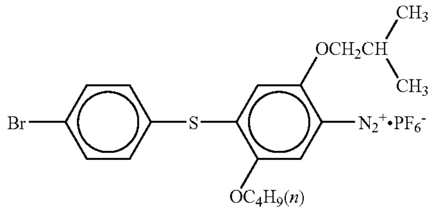
D-4

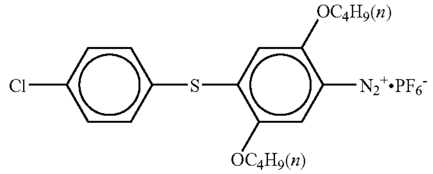
D-5

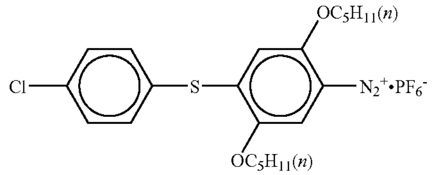
D-6

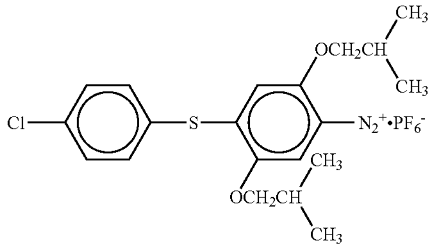
D-7

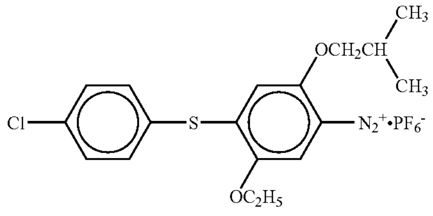
D-8

-continued
D-9
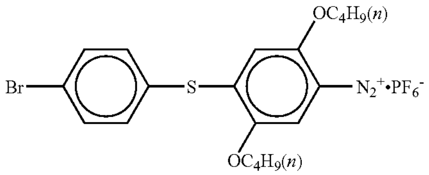
D-10
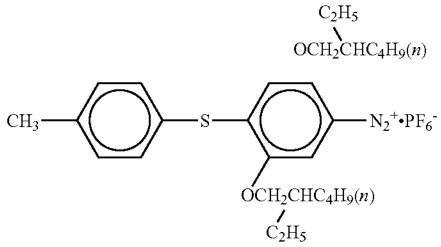
D-11
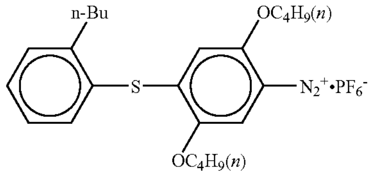
D-12
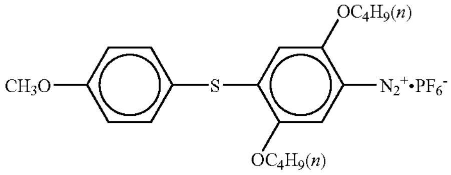
D-13
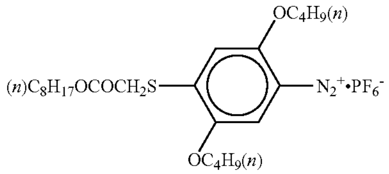
D-14
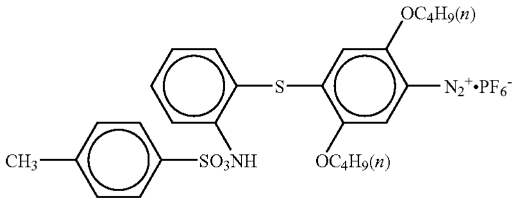
D-15
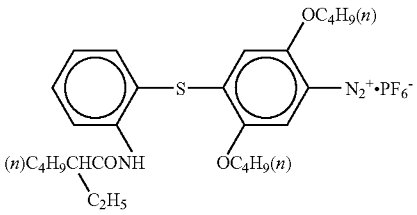
D-16
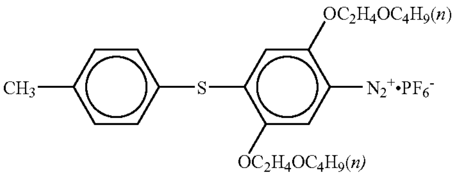
-continued
D-17
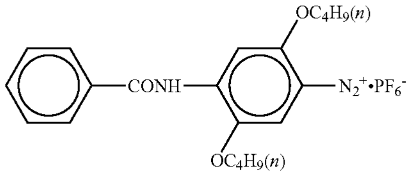
D-18
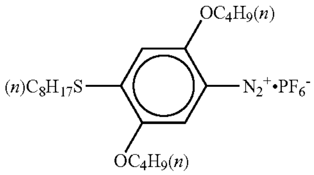
D-19
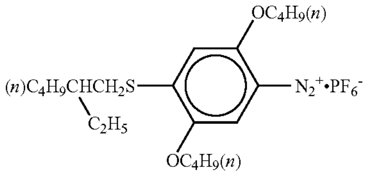
D-20
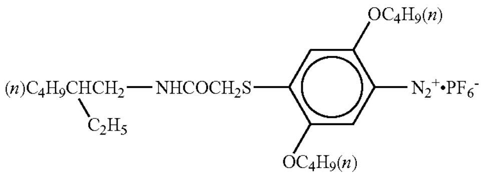
D-21
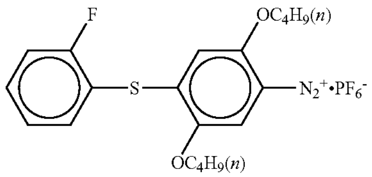
D-22
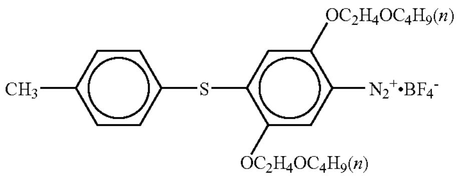
D-23
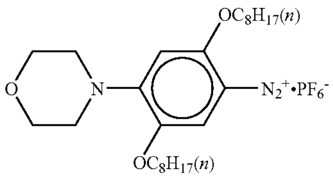
D-24
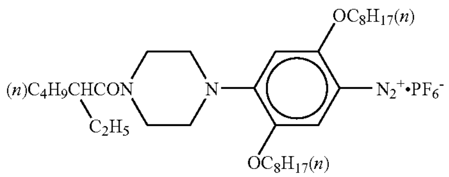
D-25
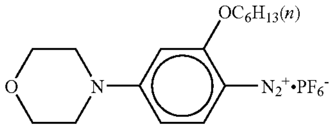

-continued
D-26
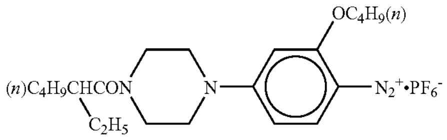
D-27
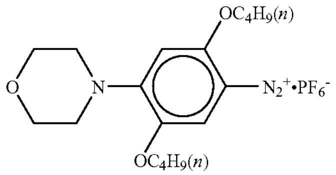
D-28
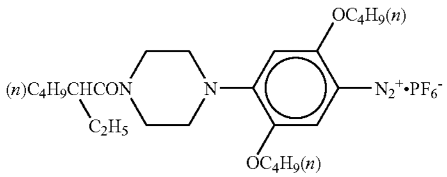
D-29
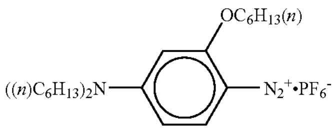
D-30
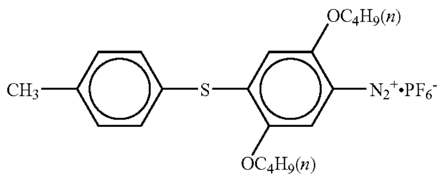
D-31
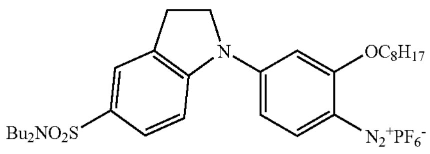
D-32
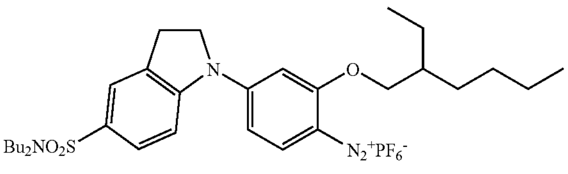
D-33
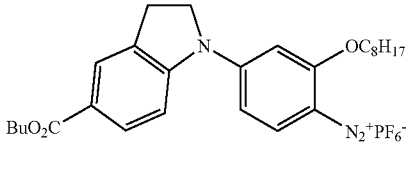
D-34
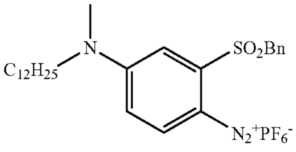
-continued
D-35
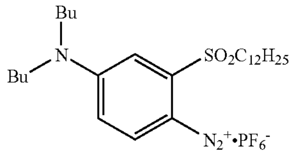
Example of Diazonium compound represented by the general formula (3):
D-36
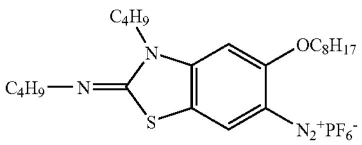
D-37
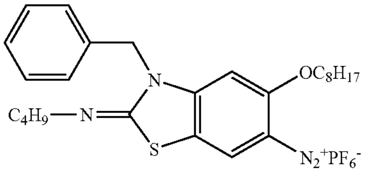
D-38
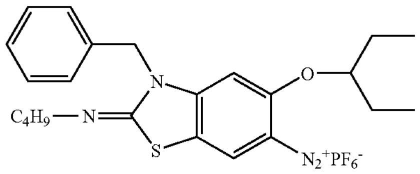
D-39
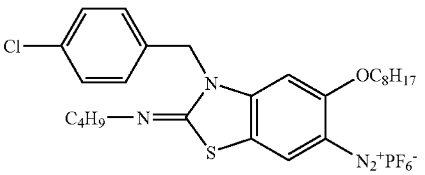
D-40
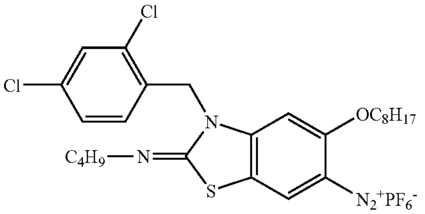
D-41
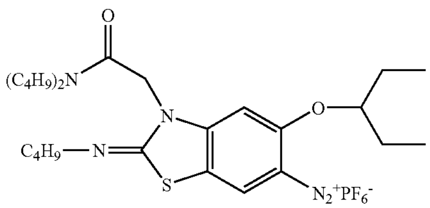
D-42
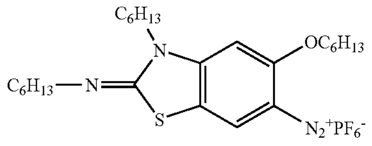

-continued
D-43
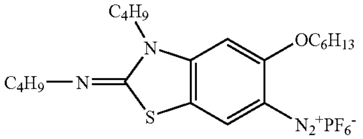
D-44
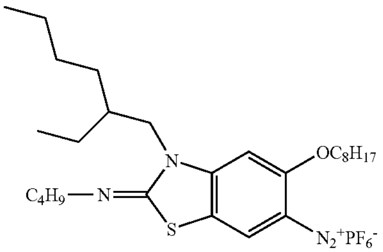
D-45
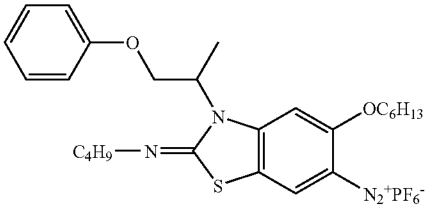
D-46
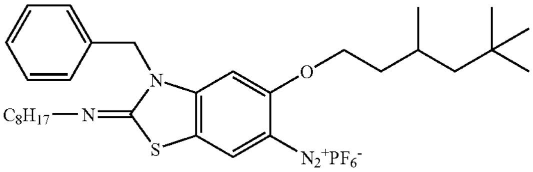
D-47
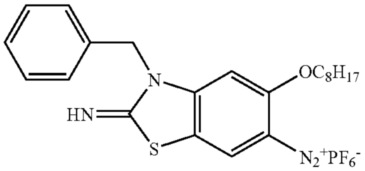
D-48
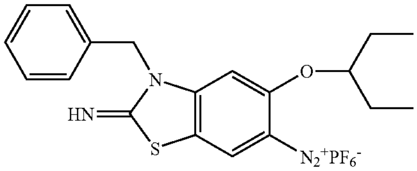
D-49
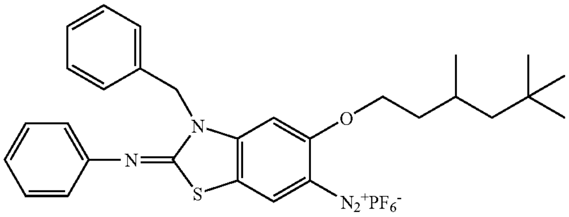
-continued
D-50
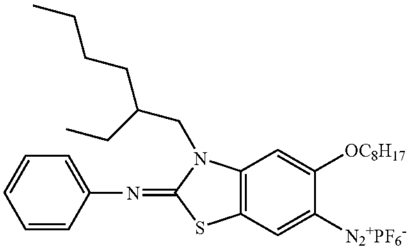
D-51
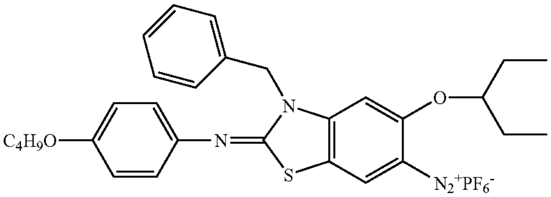
D-52
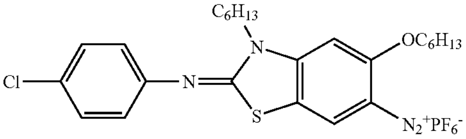
D-53
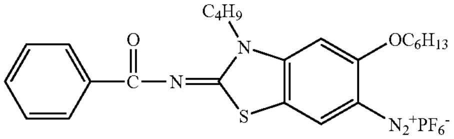
D-54
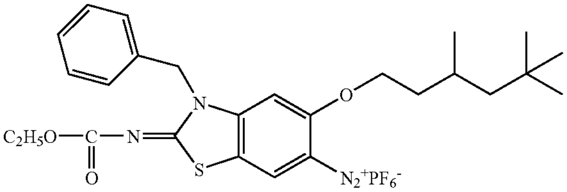
D-55
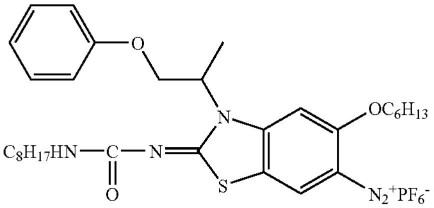
D-56
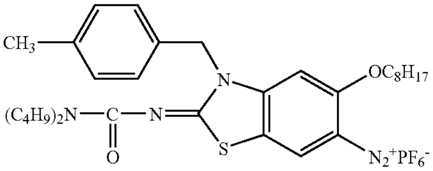
D-57
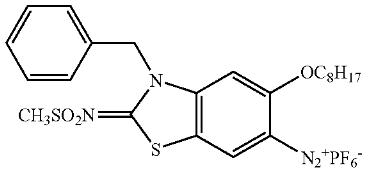

-continued
D-58
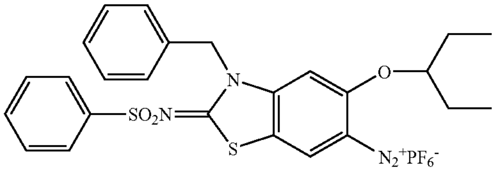
D-59
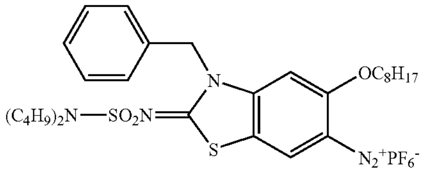
D-60
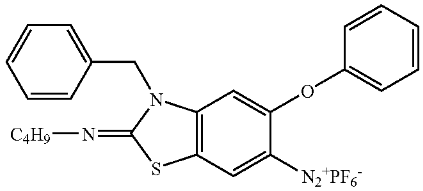
Example of Diazonium compound represented by the general formula (4):
(D-66)
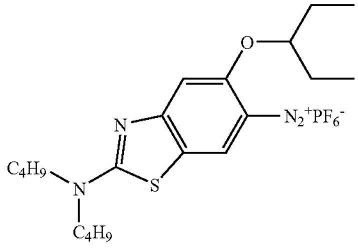
(D-67)
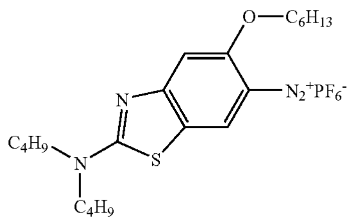
(D-68)
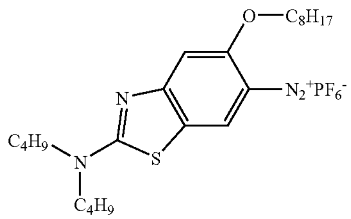
-continued
(D-69)
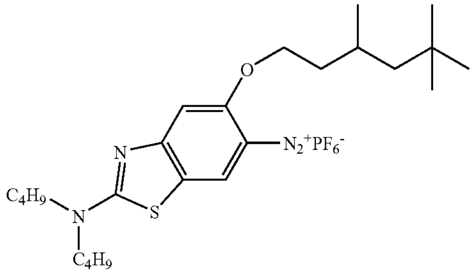
(D-70)
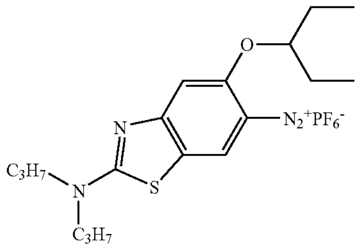
(D-71)
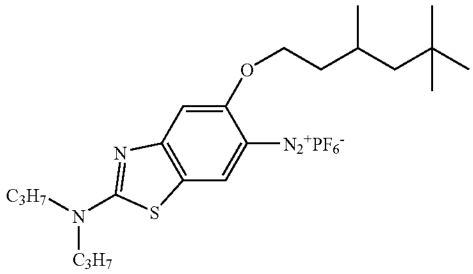
(D-72)
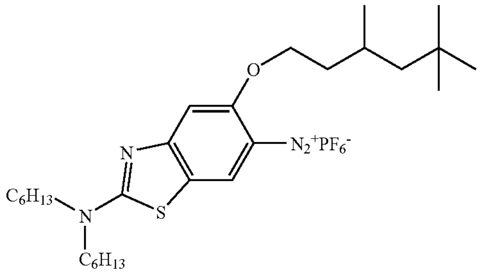
(D-73)
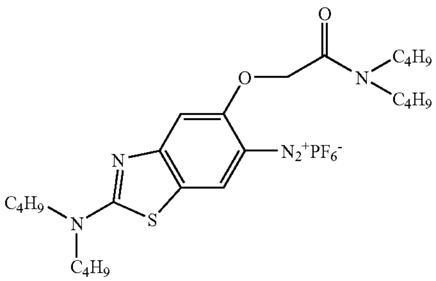
(D-74)
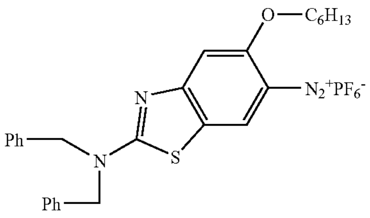

-continued
(D-75)
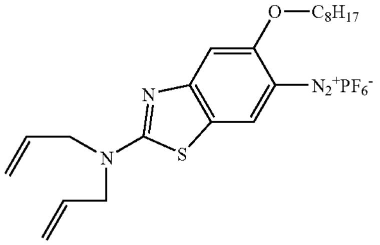
(D-76)
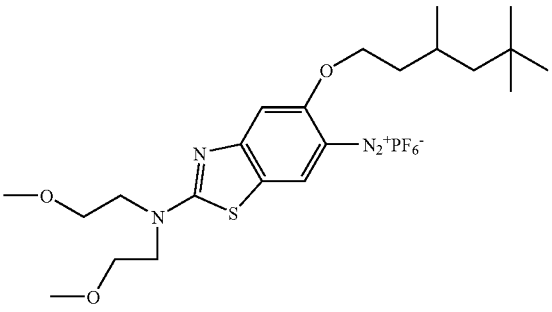
(D-77)
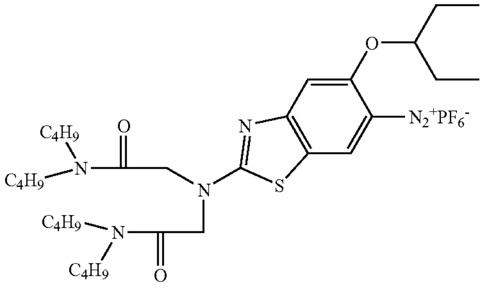
(D-78)
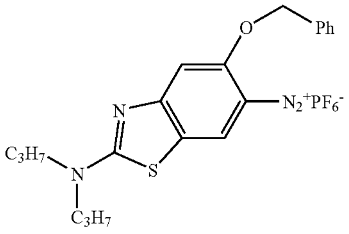
(D-79)
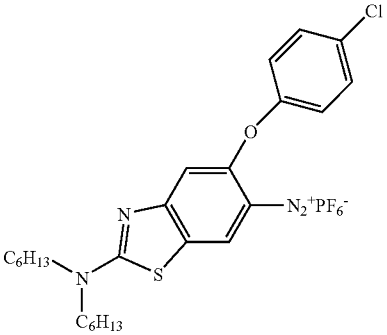
-continued
(D-80)
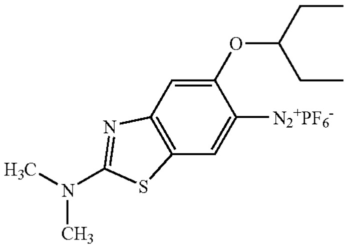
(D-81)
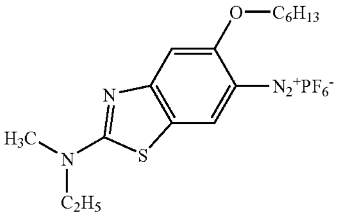
(D-82)
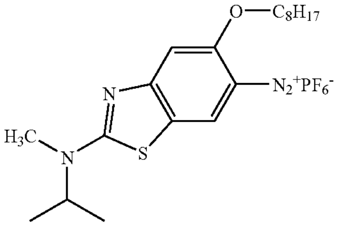
(D-83)
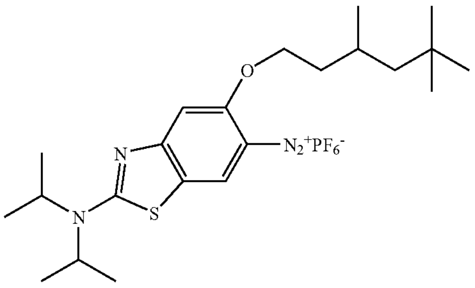
(D-84)
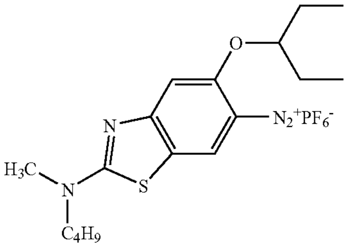
(D-85)
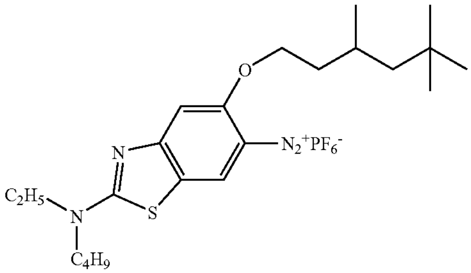

-continued (D-86)

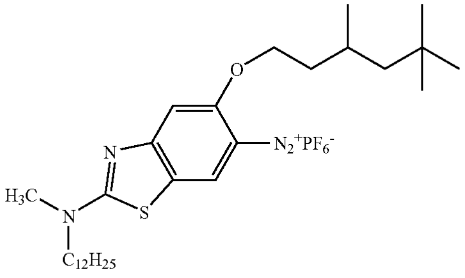

(D-87)

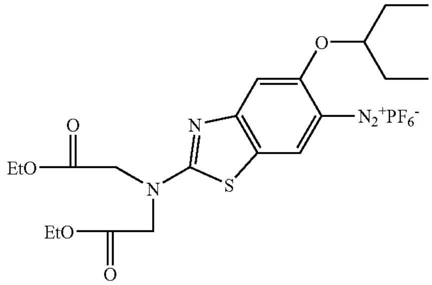

(D-88)

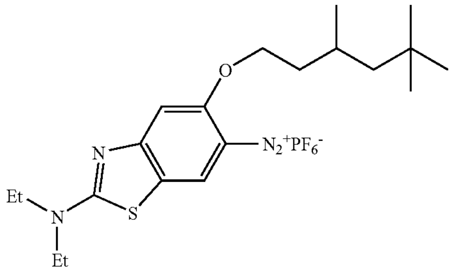

(D-89)

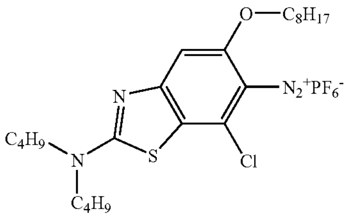

(D-90)

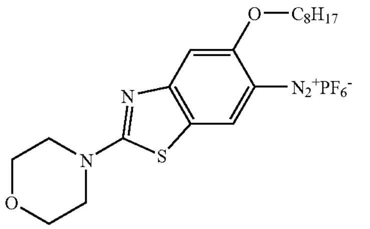

(D-91)

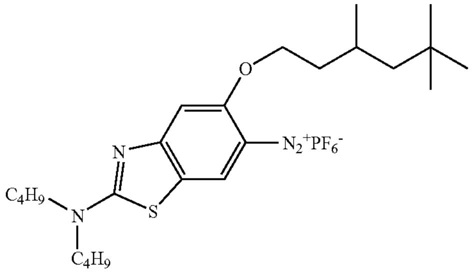

-continued (D-92)

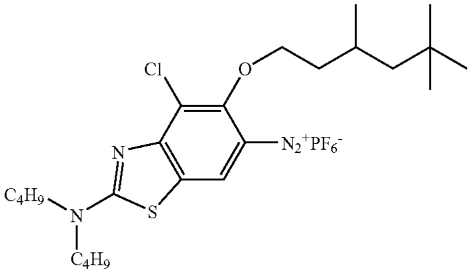

The diazonium salts represented by the general formulae (2) to (4) may be used alone or as combinations of two or more thereof. Further, the diazonium salts represented by the general formulae (2) to (4) can be used in combination with known diazo compounds in response to various purposes, including color hue adjustment. In the combined use of the diazonium salts of the general formulae (2) to (4) and known diazo compounds, it is appropriate that the diazonium salts of formulae (2) to (4) constitute at least 50% by mass, preferably at least 80% by mass, of the total diazo compounds contained in the recording layer. And it is preferable that the diazonium salts used in the invention are diazonium salts represented by the general formula (3) or (4), especially diazonium salts represented by formula (3).

Examples of known diazo compounds suitable for the combined use include 4-diazo-1-dimethylaminobenzene, 4-diazo-2-butoxy-5-chloro-1-dimethylaminobenzene, 4-diazo-1-methylbenzylaminobenzene, 4-diazo-1-ethylhydroxyethylaminobenzene, 4-diazo-1-diethylamino-3-methoxybenzene, 4-diazo-1-morholinobenzene, 4-diazo-1-morpholino-2,5-dibutoxybenzene, 4-diazo-1-toluylmercapto-2,5-diethoxybenzene, 4-diazo-1-piperazino-2-methoxy-5-chlorobenzene, 4-diazo-1-(N,N-dioctylaminocarbonyl)benzene, 4-diazo-1-(4-tert-octylphenoxy)benzene, 4-diazo-1-(2-ethylhexanoylpiperidino)-2,5-dibutoxybenzne, 4-diazo-1-[α-(2,4-di-tert-amylphenoxy)butyrylpiperidino]benzene, 4-diazo-1-(4-methoxy)phenylthio-2,5-diethoxybenzene, 4-diazo-1-(4-methoxy)benzamido-2,5-diethoxybenzene, and 4-diazo-1-pyrrolidino-2-methoxybenzene.

Further, for enhancing unprocessed stock storability of the recording material of the invention before use, it is advantageous that the diazo compounds are encapsulated in microcapsule, as described hereinafter. In the micro encapsulation, the diazo compounds are used in a state that they are dissolved in appropriate solvents, so it is desirable for them to have appropriate solubility in those solvents and low solubility in water. Specifically, the diazo compounds suitable for micro encapsulation are those having at least 5% solubility in solvents used and at most 1% solubility in water.

In the recording material of the invention, it is appropriate that the content of diazo compounds in the recording layer be from 0.02 to 3 $g/m^2$, particularly from 0.1 to 2 $g/m^2$ from a viewpoint of the density of developed color.

(Microcapsules)

In order to enhance unprocessed stock storability of the recording material of the invention before use, it is preferable that the diazo compounds are enclosed in microcapsules.

The microcapsules used in this case are made as follows. The diazonium salts and similar or different kinds of compounds capable of forming a polymer by reacting with each other are dissolved in a nonaqueous solvent having a boiling point of 40 to 95° C. at normal atmospheric pressure, and emulsified in a hydrophilic protective colloid solution. Then, the compounds to form the wall of microcapsules are made to move to the oil droplet surface while removing the solvent by raising the emulsion temperature as the pressure in the reaction vessel is reduced, and the polymer-forming reaction by polyaddition or polycondensation is made to progress at the oil droplet surface, thereby forming a wall film to complete micro encapsulation.

From a viewpoint of achieving a satisfactory shelf life in particular, it is preferable that microcapsules containing substantially no solvent as described hereinafter are used in the recording material of the invention. In addition, it is advantageous that the polymer forming the microcapsule wall is at least either polyurethane or polyurea.

Now, methods of making microcapsules (with polyurea/polyurethane wall) containing diazonium salts used in the invention are described in detail.

To begin with, the diazo compounds are dissolved in a hydrophobic organic solvent to be the cores of microcapsules. The hydrophobic organic solvent suitably used therein is an organic solvent having a boiling point in the range 100-300° C. Examples of such an organic solvent include aromatic hydrocarbons, halogenated hydrocarbons, carboxylic acid esters, phosphoric acid esters, sulfuric acid esters, sulfonic acid esters, ketones and ethers. More specifically, these organic solvents are alkylnaphthalenes, alkyldiphenylethanes, alkyldiphenylmethanes, alkylbiphenyls, chlorinated paraffins, trixylyl phosphpate, tricresyl phosphate, dioctyl maleate and dibutyl adipate. These compounds may be used alone or as combinations of two or more thereof.

When the diazo compound intended to be encapsulated in microcapsule has inferior solubility in an organic solvent as recited above, a low-boiling solvent in which the diazo compound has high solubility can be used together with the organic solvent. Examples of such a low-boiling solvent include ethyl acetate, butyl acetate, methylene chloride, tetrahydrofuran and acetone. To the hydrophobic organic solvent to be the cores of microcapsules, polyisocyanate is further added as a wall material (oil phase).

As a water phase, on the other hand, a water solution of water-soluble polymer, such as polyvinyl alcohol or gelatin, is readied. Then, the oil phase is poured into the water phase and emulsified with a device, such as a homogenizer. In this emulsifying step, the water-soluble polymer functions as an emulsion stabilizer. In addition, a surfactant may be added to at least either the oil phase or the water phase for the purpose of performing emulsification with higher stability.

It is appropriate to determine the amount of polyisocyanate used so that the microcapsules formed have an average capsule diameter of 0.3 to 12 μm and a wall thickness of 0.01 to 0.3 μm. The diameters of dispersed particles are generally of the order of 0.2-10 μm. In the emulsion, polymerization reaction of polyisocyanate takes place at the interface between the oil phase and the water phase, thereby forming a polyurea wall.

If polyol is added to the water phase in advance, on the other hand, a polyurethane wall can be formed by reaction of the polyol with the polyisocyanate. In this case, it is appropriate that the reaction system be kept at a high temperature, for accelerating the reaction. In addition, it is also advantageous to add an appropriate polymerization catalyst. Details of polyisocyanates, polyols, reaction catalysts and polyamines to constitute wall materials can be found, e.g., in Polyurethane Handbook, compiled by Keiji Iwata, published by The Nikkan Kogyo Shinbun Ltd. (1987).

The polyisocyanate compound suitable for a raw material of the microcapsule wall is a trifunctional or higher isocyanate compound. However, such a compound may be used in combination with a difunctional isocyanate compound. Examples of such a polyisocyanate compound include dimers or trimers (biuret or isocyanurate) prepared mainly from diisocyanates, such as xylenediisocyanate and hydrogenation products thereof, hexamethylene diisocyanate, tolylenediisocyanate and hydrogenation products thereof, and isophoronediisocyanate; polyfunctional compounds as adducts formed by treating diisocyanates as recited above with polyols, such as trimethylolpropane; and formaldehyde-benzeneisocyanate condensate.

Further, polyol or polyamine can be used as one of raw materials for microcapsule wall by adding it in advance to a hydrophobic solvent to from cores or a water-soluble polymer solution used as a dispersion medium. Examples of such polyol or polyamine include propylene glycol, glycerol, trimethylolpropane, triethanolamine, sorbitol and hexamethylenediamine. When polyol is added, a polyurethane wall is formed.

The water-soluble polymer contained in an aqueous solution dispersing the oil phase of microcapsules prepared in the aforementioned manner is preferably a water-soluble polymer having a solubility of at least 5 in water at the temperature chosen for emulsification. Examples of such a water-soluble polymer include polyvinyl alcohol and modifications thereof, polyacrylic acid amide and derivatives thereof, ethylene-vinyl acetate copolymer, styrene-maleic anhydride copolymer, ethylene-maleic anhydride copolymer, isobutylene-maleic anhydride copolymer, polyvinyl pyrrolidone, ethylene-acrylic acid copolymer, vinyl acetate-acrylic acid copolymer, carboxymethyl cellulose, methyl cellulose, casein, gelatin, starch derivatives, gum arabic, and sodium alginate.

It is advantageous that these water-soluble polymers are lacking or low in reactivity with isocyanate compounds. For instance, it is appropriate that polymers having reactive amino groups in their molecular chains, such as gelatin, be modified in advance so as to lose their reactivity. In the case of adding a surfactant, the suitable amount of the surfactant added is from 0.1% to 5% by mass, particularly from 0.5% to 2% by mass, of the oil phase.

For emulsification can be used known emulsifying apparatus, such as a homogenizer, a manton-Goulin, a ultrasonic dispersing machine and a Kdmill. After emulsification, the emulsion formed is heated to 30-70° C. for promoting the capsule-wall formation reaction. In order to inhibit microcapsules from aggregating during the reaction, it is preferable to lower the probability of collisions among microcapsules by addition of water or stir sufficiently.

On the other hand, a dispersing agent for aggregation control may be added once more during the reaction. With the progress of polymerization reaction, evolution of carbon dioxide gas is observed. So the end of the gas evolution can be regarded as a rough endpoint of capsule-wall forming reaction. In general, the intended microcapsules in which diazonium salts are enclosed can be obtained by performing the reaction for several hours.

(Organic Base)

To the recording material of the invention, organic bases may be added for the purpose of promoting coupling reaction of diazo compounds with couplers.

Those organic bases may be used alone or as combinations of two or more thereof. Examples of the organic bases include nitrogen-containing compounds, such as tertiary amines, piperidines, piperazines, amidines, formamidines, pyridines, guanidines and morpholines.

Among these compounds, easpecially preferred ones are piperazines, such as N,N'-bis(3-phenoxy-2-hydroxypropyl) piperazine, N,N'-bis[3-(p-methylphenoxy)-2-hydroxypropyl]piperazine, N,N'-bis[3-(p-methoxyphenoxy)-2-hydroxypropyl]piperazine, N,N'-bis(3-phenylthio-2-hydroxypropyl)piperazine, N,N'-bis[3-(β-naphthoxy)-2-hydroxypropyl]piperazine, N-3-(β-naphthoxy)-2-hydroxypropyl-N'-methylpiperazine and 1,4-bis{[3-(N-methylpiperazino)-2-hydroxy]propyloxy}benzene; morpholines, such as N-[3-(β-naphthoxy)-2-hydroxy]propylmorpholine, 1,4-bis[(3-morpholino-2-hydroxy)propyloxy] benzene and 1,3-bis[(3-morpholino-2-hydroxy)propyloxy] benzene; piperizines such as N-(3-pheoxy-2-hydroxypropyl)piperizine and N-dodecylpiperizine, and guanidines, such as triphenylguanidine, tricyclohexylguanidine and dicyclohexylphenylguanidine.

The suitable amount of organic bases used in the recording material of the invention is from 0.1 to 30 parts by mass per 1 part by mass of diazo compounds.

(Antioxidant)

In addition to the organic bases, color forming auxiliaries can be added in the invention for the purpose of promoting the color formation reaction. The term "color forming auxiliaries" refers to the substances capable of heightening the densities of developed colors at the time of thermal recording or lowering the minimum temperature required for color formation. Further, it is required for the color forming auxiliaries to have functions of lowering melting temperatures of couplers, basic substances or diazo compounds and lowering the softening temperature of the capsule wall, and thereby to create situations in which diazo compounds, basic substances and couplers are subject to reaction.

To the present recording layer, for instance, phenol derivatives, naphthol derivatives, alkoxy-substituted benzenes, alkoxy-substituted naphthalenes, hydroxy compounds, amide compounds and sulfonamide compounds can be added as color forming auxiliaries so that heat development is accomplished with low energy and rapidity. Those compounds can lower the melting points of couplers and basic substances, or they can enhance heat permeability of microcapsule walls. As a result, high densities of developed colors are thought to be attainable.

The color forming auxiliaries used in the recording material of the invention may be heat melting substances. The heat melting substances are substances which are in a solid state at room temperature and can melt by heating at their melting points in the range of 50° C. to 150° C. In addition, the heat melting substances are substances into which diazo compounds, couplers or basic substances can be dissolved. Examples of such compounds include carboxylic acid amides, N-substituted carboxylic acid amides, ketone compounds, urea compounds and esters.

(Other Additives)

In the recording material of the invention, it is preferable to use known antioxidants as recited below for the purpose of enhancing light fastness and thermal-fading stability of thermally developed color images or reducing a change of unprinted-portion color to yellow by exposure to light after fixation.

Those antioxidants are disclosed, e.g., in EP-A-223739, EP-A-309401, EP-A-309402, EP-A-310551, EP-A-310552, EP-A-459416, German Patent Application Laid-open No. 3,435,443, JP-A-54-48535, JP-A-62-262047, JP-A-63-113536, JP-A-63-163351, JP-A-2-262654, JP-A-2-71262, JP-A-3-121449, JP-A-5-61166, JP-A-5-119449, and U.S. Pat. Nos. 4,814,262 and 4,980,275.

It is also effective to further use a wide variety of additives already adopted in known thermal recording materials and pressure-sensitive recording materials. For instance, the antioxidants effectively used in the invention include the compounds disclosed in JP-A-60-107384, JP-A-60-107383, JP-A-60-125470, JP-A-60-125471, JP-A-60-125472, JP-A-60-287485, JP-A-60-287486, JP-A-60-287487, JP-A-60-287488, JP-A-61-160287, JP-A-61-185483, JP-A-61-211079, JP-A-62-146678, JP-A-62-146680, JP-A-62-146679, JP-A-62-282885, JP-A-63-051174, JP-A-63-89877, JP-A-63-88380, JP-A-63-088381, JP-A-63-203372, JP-A-63-224989, JP-A-63-251282, JP-A-63-267594, JP-A-63-182484, JP-A-01-239282, JP-A-04-291685, JP-A-04-291684, JP-A-05-188687, JP-A-05-188686, JP-A-05-110490, JP-A-05-1108437, JP-A-05-170361, JP-B-48-043294 and JP-B-48-033211.

More specifically, 6-ethoxy-1-phenyl-2,2,4-trimethyl-1,2-dihydroquinoline, 6-ethoxy-1-octyl-2,2,4-trimethyl-1,2-dihydroquinoline, 6-ethoxy-1-phenyl-2,2,4-trimethyl-1,2,3,4-tetrahydroquinoline, 6-ethoxy-1-octyl-2,2,4-trimethyl-1,2,3,4-tetrahydroquinoline, nickel cyclohexanoate, 2,2-bis-4-hydroxyphenylpropane, 1,1-bis-4-hydroxyphenyl-2-ethylhexane, 2-methyl-4-methoxy-diphenylamine and 1-methyl-2-phenylindole can be recited as those antioxidants.

The suitable proportion of antioxidants added is from 0.05 to 100 parts by mass, particularly from 0.2 to 30 parts by mass, per 1 part by mass of diazo compounds. The known antioxidants as recited above can be also used in a state that they are encapsulated together with the diazo compounds in microcapsule. On the other hand, they can be used in the form of a solid dispersion together with coupling components, basic substances and other color forming auxiliaries. Further, it is possible to use them in the form of an emulsion prepared in the presence of an appropriate emulsifying aid. Moreover, they may be used in both forms. Additionally, the antioxidants can be used alone or as combinations of two or more thereof. In another way, the antioxidants can be add to or made present in a protective layer provided on the recording layer.

It is not always required to add these antioxidants to the same layer. In using these antioxidants as a combination of two or more thereof, they are classified on the basis of chemical structure into groups of anilines, alkoxybenzenes, hindered phenols, hindered amines, hydroquinone derivatives, phosphorus compounds and sulfur compounds, and compounds different in chemical structure may be chosen from those groups for the combination. On the other hand, the combination may be made of two or more compounds chosen from a group similar in chemical structure.

When couplers are used in the invention, they may be dispersed together with basic substances and other color forming auxiliaries in the presence of a water-soluble polymer by use of a sand mill or the like and made into a solid dispersion, but it is particularly preferred to make them into an emulsion by use of an appropriate emulsifying aid. Suitable examples of a water-soluble polymer used therein include water-soluble polymers usable for preparing microcapsules (See, e.g., JP-A-59-190886). In this case, it is appropriate that the couplers be added in a proportion of 5 to 40% by mass to the water-soluble polymer solution, the basic substances also be charged in the same proportion range as the above, and the color forming auxiliaries also be charged in the same proportion range as the above. The suitable sizes of dispersed or emulsified particles are 10 μm or below.

In order to reducing a change of background color to yellow after fixation, a free radical generating agent (a compound generating free radicals by irradiation with light) used in a photo-polymerizing composition can be added to the recording material of the invention. Examples of such a free radical generating agent include aromatic ketones, quinones, benzoin, benzoin ethers, azo compounds, organic disulfides and acyloxime esters. The suitable amount of the free radical generating agent added is from 0.01 to 5 parts by mass per 1 part by mass of diazo compounds.

It is also possible to use a polymerizable compound having an ethylenic unsaturated bond (sometimes referred to as "a vinyl monomer") for the same purpose of reducing the color change to yellow. The term "a vinyl monomer" is defined as a compound containing at least one ethylenic unsaturated bond (a vinyl or vinylidene group) in its chemical structure and having the chemical form of a monomer or a prepolymer. Examples thereof include unsaturated carboxylic acids and salts thereof, esters prepared from unsaturated carboxylic acids and aliphatic polyhydric alcohol, and amide compounds prepared from unsaturated carboxylic acids and aliphatic polyamines.

The suitable proportion of vinyl monomers used is from 0.2 to 20 parts by mass per 1 part by mass of diazo compounds. It is also possible to use the free radical generating agent and vinyl monomers in a state that they are encapsulated together with diazo compounds in microcapsule. Besides the substances recited above, acid stabilizers including citric acid, tartaric acid, oxalic acid, boric acid, phosphoric acid and pyrophosphoric acid can be added in the invention.

The recording material of the invention is prepared by forming a recording layer on a support in a manner that a coating composition prepared so as to contain diazo compounds enclosed in microcapsules, couplers, organic bases and other additives is coated on a support, such as paper or a synthetic resin film, in accordance with a coating method, such as bar coating, blade coating, air knife coating, gravure coating, roll coating, spray coating, dip coating or curtain coating, was dried. In the recording material of the invention, it is appropriate to provide the recording layer at a coverage of 2.5 to 30 $g/m^2$ on a solids basis.

In the recording material of the invention, the microcapsules, the couplers and the bases may be incorporated in the same layer. On the other hand, the recording material of the invention may have a multilayer structure that those ingredients are incorporated in separate layers. Further, it is also possible to provide on a support the intermediate layer as described in Japanese Patent Application No. 59-177669, and then coat the intermediate layer with the thermal recording layer.

<Support>

The support used in the recording material of the invention may be any of paper supports used for general pressure-sensitive paper, thermosensitive paper and dry or wet diazo-type copying paper. Other examples of a paper support usable in the invention include neutral paper which is sized with a neutral sizing agent, such as alkylketene dimers, and has its pH in the range of 5 to 9 (as described in Japanese Patent Application No. 55-14281); paper satisfying the relation between Stöckigt sizing degree and basis weight expressed in $g/m^2$ as disclosed in JP-A-57-116687, and having Bekk smoothness of at least 90 seconds; paper which is 8 μm or below in the optical surface roughness described in JP-A-58-136492, and has a thickness of 30 to 150 μm; the paper as disclosed in JP-A-58-69091, which has a density of 0.9 $g/cm^3$ or below and an optical contact rate of 15% or greater; the paper as disclosed in JP-A-58-69097, which is made from pulp beating-treated so as to have Canadian standard freeness (JIS P8121) of 400 ml (400 cc) or greater and thereby prevented from infiltration of coating solutions; the paper disclosed in JP-A-58-65695, which has a glossy surface of base paper made with a Yankee machine on the coating side and thereby improves density of developed color and resolution; and the paper improved in coating suitability by using the base paper disclosed in JP-A-59-35985 and subjecting it to corona discharge treatment.

The synthetic resin film used as the support can be selected from known materials having dimensional stability high enough to undergo no distortion even by heating in the development step. Examples of such materials include polyester film such as polyethylene terephthalate film and polybutylene terephthalate film, cellulose derivative film such as cellulose triacetate film, and polyolefin film such as polystyrene film, polypropylene film and polyethylene film. These films can be used alone or as laminated film. The support generally used herein has a thickness of 20 to 200 μm.

<Protective Layer>

In the invention, it is preferable to further provide on the thermal recording layer a protective layer containing polyvinyl alcohol as a main component and various additives including pigments and a releasing agent, if needed, for the purposes of preventing a sticking trouble from occurring and a thermalhead from being stained when printing is done on the thermal recording layer by use of the thermalhead and imparting waterproofness to the recording material of the invention.

<Recording Method>

When the recording surface of the recording material of the invention prepared in the aforementioned method is heated with a thermalhead, the microcapsule wall made of polyurea or polyurethane is softened and allows invasion of microcapsules by couplers and basic compounds present outside the microcapsules; as a result, colors are formed. After recording, the recording material is exposed to light with wavelengths at which diazo compounds show absorption, and thereby the diazo compounds are decomposed and lose reactivity with couplers. Thus, fixation of images is effected.

Examples of a light source usable for fixation include various fluorescent lamps, a xenon lamp, a mercury lamp and LED. From the viewpoint of highly efficient fixation by light, it is advantageous that the spectrum of light emitted from the light source is in close agreement with the absorption spectra of diazo compounds used in the recording material. On the other hand, it is also possible to form images by exposing the recording material of the invention (thermal recording material) to light via an original, thereby decomposing the diazo compounds present in portions other than the image portion and forming an latent image, and then by heating the recording material to effect development.

EXAMPLE

Now, the invention will be described in more detail by reference to the following examples, but these examples should not be construed as limiting the scope of the invention in any way. Additionally, all parts described hereinafter are part by mass unless otherwise indicated.

Synthesis Example 1

Compound (A-1) exemplifying the azolinyl acetic acid derivatives relating to the invention was synthesized through the following reaction path:

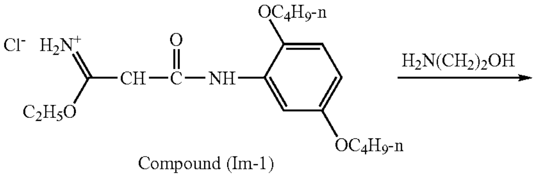

Compound (Im-1)

Compound (A-1)

The compound (Im-1) in an amount of 10.3 g was dispersed into 70 ml of chloroform, and thereto 1.71 g of ethanolamine was added with stirring at room temperature. Further, the stirring was continued for 2 hours at room temperature. Then, the resulting reaction mixture was poured into water, and therefrom an organic phase was extracted with chloroform. The organic phase thus obtained was washed with water, was dried over magnesium sulfate. After drying, the drying agent was removed by filtration, and the solvent was evaporated. The residue was purified by recrystallization from acetonitrile. Thus, 7.86 g of Compound (A-1) exemplified above was obtained as colorless crystals.

$^1$H-NMR (300 MHz, $CDCl_3$) δ: 0.95(t, 3H), 0.99(t, 3H), 1.48(dt, 2H), 1.55(dt, 2H), 1.72(dd, 2H), 1.82(dt, 2H), 3.42(s, 2H), 3.90-4.00(m, 6H), 4.32(t, 2H), 6.58(dd, 1H), 6.78(d, 1H), 8.14(d, 1H)

Synthesis Example 2

Compound (A-7) exemplifying the azolinyl acetic acid derivatives relating to the invention was synthesized through the following reaction path:

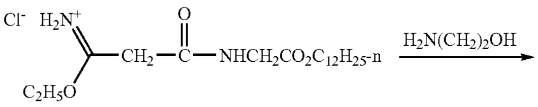

Compound (Im-2)

Compound (A-7)

The compound (Im-2) in an amount of 15.5 g was dispersed into 80 ml of chloroform, and thereto 2.41 g of ethanolamine was added with stirring at room temperature. Further, the stirring was continued for 2 hours at room temperature. Then, the resulting reaction mixture was poured into water, and therefrom an organic phase was extracted with chloroform. The thus extracted organic phase was washed with water, was dried over magnesium sulfate. After drying, the drying agent was removed by filtration, and the solvent was evaporated. The residue was purified by column chromatography. Thus, 8.87 g of Compound (A-7) exemplified above was obtained as colorless powder.

$^1$H-NMR (300 MHz, $CDCl_3$) δ: 0.95(t, 3H), 1.10-1.40(m, 18H), 1.60(m, 2H), 1.96(s, 2H), 3.38(s, 2H), 3.91(t, 2H), 4.01(d, 1H), 4.10 (t, 2H), 4.33(t, 2H)

Synthesis Example 3

Compound (A-9) exemplifying the azolinyl acetic acid derivatives relating to the invention was synthesized through the following reaction path:

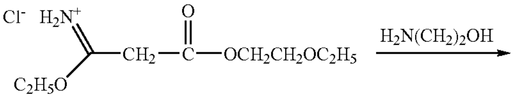

Compound (Im-3)

Compound (A-9)

The compound (Im-3) in an amount of 38.0 g was dispersed into 200 ml of chloroform, and thereto 6.11 g of ethanolamine was added with stirring at room temperature. Further, the stirring was continued for 2.5 hours at room temperature. Then, the resulting reaction mixture was poured into water, and therefrom an organic phase was extracted with chloroform. The thus extracted organic phase was washed with water, and was dried over magnesium sulfate. After drying, the drying agent was removed by filtration, and the solvent was evaporated. The residue was purified by column chromatography. Thus, 26.8 g of Compound (A-9) exemplified above was obtained as colorless oily matter.

$^1$H-NMR (300 MHz, $CDCl_3$) δ: 1.25(t, 3H), 3.80-4.00(m, 6H), 3.39(s, 2H), 3.90(t, 2H), 4.32(t, 2H)

Synthesis Example 4

Compound (A-19) exemplifying the azolinyl acetic acid derivatives relating to the invention was synthesized through the following reaction path:

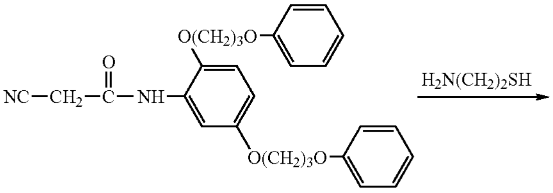

Compound (CN-1)

Compound (A-19)

The compound (CN-1) in an amount of 13.8 g and ethanethiol in an amount of 2.43 g were dispersed into 100 ml of ethanol, and heated under reflux for 1.5 hours. After cooling, the resulting reaction mixture was poured into water, and therefrom an organic phase was extracted with ethyl acetate. The organic phase thus obtained was washed with water, was dried over magnesium sulfate. After drying, the drying agent was removed by filtration, and the solvent was evaporated. The residue was purified by recrystallization from acetonitrile. Thus, 12.2 g of Compound (A-19) exemplified above was obtained as colorless crystals.

$^1$H-NMR (300 MHz, $CDCl_3$) δ: 2.23(dd, 2H), 2.31(dd, 2H), 3.24(t, 2H), 3.60(s, 2H), 4.05-4.32(m, 10H), 6.57(dd, 1H), 6.80(d, 1H), 6.88-7.01(m, 6H), 7.21-7.36(m, 4H), 8.16(d, 1H)

Synthesis Example 5

Compound (A-30) exemplifying the azolinyl acetic acid derivatives relating to the invention was synthesized through the following reaction path:

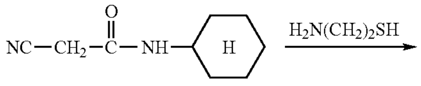

Compound (A-30)

Compound (CN-2)

The compound (CN-2) in an amount of 13.0 g and ethanethiol in an amount of 7.20 g were dispersed into 100 ml of ethanol, and heated under reflux for 2.5 hours. After cooling, the resulting reaction mixture was poured into water, and therefrom an organic phase was extracted with ethyl acetate. The organic phase thus obtained was washed with water, was dried over magnesium sulfate. After drying, the drying agent was removed by filtration, and the solvent was evaporated. The residue was purified by recrystallization from methanol. Thus, 10.2 g of Compound (A-30) exemplified above was obtained as colorless crystals.

$^1$H-NMR (300 MHz, $CDCl_3$) δ: 1.10-2.00(m, 10H), 3.30 (t, 2H), 3.22(s, 2H), 3.70-3.88(m, 1H), 4.30(t, 2H), 7.62(bs, 1H)

Synthesis Example 6

Compound (A-34) exemplifying the azolinyl acetic acid derivatives relating to the invention was synthesized through the following reaction path:

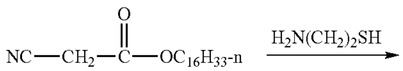

Compound (A-34)

Compound (CN-3)

The compound (CN-3) in an amount of 15.0 g and ethanethiol in an amount of 4.20 g were dispersed into 80 ml of t-butanol, and heated under reflux for 2.5 hours. After cooling, the resulting reaction mixture was poured into water, and therefrom an organic phase was extracted with ethyl acetate. The organic phase thus obtained was washed with water, was dried over magnesium sulfate. After drying, the drying agent was removed by filtration, and the solvent was evaporated. The residue was purified by recrystallization from acetonitrile. Thus, 10.2 g of Compound (A-34) exemplified above was obtained as colorless crystals.

$^1$H-NMR (300 MHz, $CDCl_3$) δ: 0.94(t, 3H), 1.20-1.70(m, 29H), 3.20(t, 0.66H), 3.36(t, 1.34H), 3.56(s, 1.34H), 3.80(t, 0.66H), 4.03(t, 0.66H), 4.14(t, 1.32H), 4.25(t, 1.34H), 4.76 (s, 0.33H), 8.22(s, 0.33H)

Example 1

<<Production of Diazo Thermal Recording Material>>

(Preparation of Capsule Solution A)

To 19 parts of ethyl acetate were added 2.8 parts of the diazonium salt described above as an example (Compound (D-38) above) and 10 parts of tricresyl phosphate, and they were mixed homogeneously. To the solution thus prepared was added 7.6 parts of xylylenediisocyanate-trimethylolpropane adduct (trade name: Takenate D110N (75% ethyl acetate solution), manufactured by Mitsui Takeda Chemicals, Inc.), and they were mixed homogeneously to prepare a solution I.

The solution I obtained was added to an aqueous phase made up of 46.1 parts of an 8% by mass of water solution of phthaloylated gelatin, 17.5 parts of water and 2 parts of a 10% water solution of sodium dodecylbenzenesulfonate, and emulsified for 10 minutes under the conditions of 40° C. and 10,000 r.p.m. The emulsion thus prepared was admixed with 20 parts of water, and rendered homogeneous. Thereafter, stirring of the emulsion thus prepared was further continued for 3 hours at 40° C. to effect encapsulation reaction. Thus, a capsule solution A was obtained. The capsule size was found to be 0.35 μm.

(Preparation of Coupler Solution B)

In 8 parts of ethyl acetate, 4 parts of the coupler described in Synthesis Example 1 (Compound (A-1)), 2 parts of triphenylguanidine, 0.64 parts of tricresyl phosphate and 0.32 parts of diethyl maleate were dissolved to prepare a solution II. The solution II thus obtained was added to an aqueous phase prepared by homogeneously mixing 32 parts of a 15% by mass water solution of lime-processed gelatin, 5 parts of a 10% water solution of sodium dodecylbenzenesulfonate and 30 parts of water at 40° C. Thereafter, this admixture was emulsified with a homogenizer for 10 minutes under the conditions of 40° C. and 10,000 r.p.m. The emulsion thus obtained was stirred for 2 hours at 40° C. to remove the ethyl acetate therefrom. Then, the mass of the evaporated ethyl acetate and water was supplemented by adding water to prepare a coupler solution B.

(Preparation of Coating Solution C for Thermal Recording Layer)

The capsule solution A in an amount of 6 parts was mixed homogeneously with 4.4 parts of water and 1.9 parts of a 15% by mass water solution of lime-processed gelatin at 40° C., and thereto 8.3 parts of the coupler solution B was further added. These ingredients were mixed homogeneously to prepare a coating solution C for thermal recording layer.

(Preparation of Coating Solution D for Protective Layer)

A 10% water solution of polyvinyl alcohol (polymerization degree: 1700, saponification degree: 88%) in an amount of 32 parts was mixed homogeneously with 36 parts of water to prepare a coating solution D for protective layer.

(Coating)

On a photographic paper support made by laminating wood free paper with polyethylene, the coating solution C for thermal recording layer and the coating solution D for protective layer were coated successively in the order of mention by means of a wire bar, were dried at 50° C. to prepare the intended diazo thermal recording material. The coverage of the thermal recording layer and that of the protective layer were 6.4 g/m$^2$ and 1.05 g/m$^2$, respectively, on a solids basis.

<<Evaluation>>

(Unprocessed Stock Storability)

First, the prepared diazo thermal recording sheet was stored for 48 hours at room temperature (around 22° C.). Thereafter, on image was obtained by thermal printing of the diazo thermal recording layer using a thermal head (Model KST, manufactured by Kyocera Corp.) with a voltage and a pulse width to be applied to the thermalhead selected so as to provide a per-unit area recording energy of 0 to 40 $mJ/mm^2$. Then, the diazo thermal recording layer was exposed for 15 seconds using a 40-watt ultraviolet lamp having a central light-emission wavelength of 365 nm to fix the thermally printed images. The thus obtained sample was examined for densities of developed-color and background portions using a Macbeth reflection densitometer (trade name: RD918, manufactured by Macbeth).

In the next place, the diazo thermal recording sheet prepared in the same manner was subjected to 72-hour forced storage under the conditions of 60° C. and 30% RH, and thereon images were printed and fixed in the same manners as described above. Thereafter, the thus obtained sample was examined for densities of developed-color and background portions by means of the same Macbeth reflection densitometer as described above. The evaluation of unprocessed stock stability was made by comparing not only the densities of developed-color portions (developed-color densities) between before and after the forced storage but also the densities of background portions (coloration densities) between before and after the forced storage and detecting density differences. The results obtained are shown in Table 1.

(Light Fastness)

The sample having undergone color formation and subsequent fixation under the aforementioned conditions was subjected to a color fading test wherein it was exposed to light continuously for 24 hours by means of a light fastness tester equipped with a fluorescent lamp of 32,000 Lux, and examined for densities in the image portion and the background portion before and after the light exposure. More specifically, the section having an initial reflection density (a developed color density in the image portion before the light exposure) of about 1.1 as measured with the aforementioned Macbeth reflection densitometer was examined for changes in densities by the light exposure. The results obtained are also shown in Table 1.

Example 2

A coupler solution B was prepared in the same manner as in Example 1, except that Compound (A-7) was used in place of Compound (A-1) as the coupler. And a diazo thermal recording material was made in the same manner as in Example 1 except for the use of this coupler solution B, and evaluated by the same method as in Example 1. The results obtained are shown in Table 1.

Example 3

A coupler solution B was prepared in the same manner as in Example 1, except that Compound (A-9) was used in place of Compound (A-1) as the coupler. And a diazo thermal recording material was made in the same manner as in Example 1 except for the use of this coupler solution B, and evaluated by the same method as in Example 1. The results obtained are shown in Table 1.

Example 4

A coupler solution B was prepared in the same manner as in Example 1, except that Compound (A-19) was used in place of Compound (A-1) as the coupler. And a diazo thermal recording material was made in the same manner as in Example 1 except for the use of this coupler solution B, and evaluated by the same method as in Example 1. The results obtained are shown in Table 1.

Example 5

A coupler solution B was prepared in the same manner as in Example 1, except that Compound (A-30) was used in place of Compound (A-1) as the coupler. And a diazo thermal recording material was made in the same manner as in Example 1 except for the use of this coupler solution B, and evaluated by the same method as in Example 1. The results obtained are shown in Table 1.

Example 6

A coupler solution B was prepared in the same manner as in Example 1, except that Compound (A-34) was used in place of Compound (A-1) as the coupler. And a diazo thermal recording material was made in the same manner as in Example 1 except for the use of this coupler solution B, and evaluated by the same method as in Example 1. The results obtained are shown in Table 1.

Comparative Examples 1 to 4

Coupler solutions B for Comparative Examples 1 to 4 were prepared in the same manner as in Example 1, except that Compound (A-1) as the coupler was replaced by the same amounts (4 parts) of the following comparative Compounds A to D, respectively. And each of diazo thermal recording materials for comparison was made in the same manner as in Example 1 except for the use of such a coupler solution B, and evaluated by the same method as in Example 1. The results obtained are also shown in Table 1.

Comparative Compound A

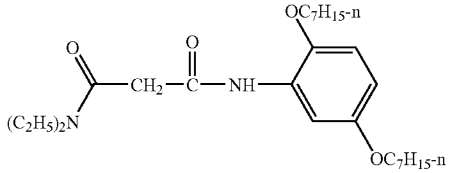

Comparative Compound B

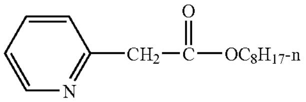

Comparative Compound C

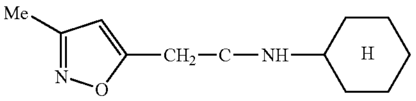

Comparative Compound D

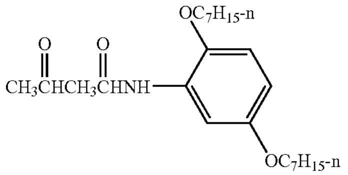

TABLE 1

| | Unprocessed stock storability | | | | Light fastness | | | |
|---|---|---|---|---|---|---|---|---|
| | Developed-color image density (image portion) | | Coloration density (background portion) | | Developed-color image density (image portion) | | Coloration density (background portion) | |
| | before forced storage | after forced storage | before forced storage | after forced storage | before exposure to light | after exposure to light | before exposure to light | after exposure to light |
| Example 1 | 1.40 | 1.39 | 0.09 | 0.10 | 1.10 | 1.05 | 0.09 | 0.11 |
| Example 2 | 1.37 | 1.35 | 0.08 | 0.09 | 1.10 | 1.03 | 0.08 | 0.09 |
| Example 3 | 1.36 | 1.33 | 0.08 | 0.09 | 1.10 | 1.02 | 0.08 | 0.09 |
| Example 4 | 1.41 | 1.40 | 0.09 | 0.10 | 1.10 | 1.08 | 0.09 | 0.10 |
| Example 5 | 1.39 | 1.38 | 0.08 | 0.08 | 1.10 | 1.07 | 0.08 | 0.08 |
| Example 6 | 1.37 | 1.36 | 0.07 | 0.07 | 1.10 | 1.05 | 0.07 | 0.08 |
| Comparative Example 1 | 1.25 | 1.10 | 0.09 | 0.15 | 1.10 | 0.90 | 0.09 | 0.20 |
| Comparative Example 2 | 1.12 | 1.08 | 0.10 | 0.12 | 1.10 | 0.81 | 0.10 | 0.16 |
| Comparative Example 3 | 1.36 | 1.30 | 0.10 | 0.13 | 1.10 | 0.80 | 0.10 | 0.15 |
| Comparative Example 4 | 1.39 | 1.24 | 0.12 | 0.13 | 1.10 | 0.85 | 0.12 | 0.22 |

As can be seen from Table 1, the diazo thermal recording materials using the azolinyl acetic acid derivative of the inventions were superior in unprocessed stock storability and color formation efficiency, and moreover reduced in coloration in the background portion due to exposure to light and superior in light fastness.

In accordance with the invention, azolinyl acetic acid derivatives useful as couplers and recording materials having excellent unprocessed-stock storability and high color formation efficiency, causing only slight coloration in the background portion due to exposure to light and ensuring excellent light fastness can be provided.

What is claimed is:

1. A recording material comprising, on a support, a recording layer containing a diazo compound and an azolinyl acetic acid derivative as a coupler which reacts with the diazo compound to form a color, wherein the azolinyl acetic acid derivative is a compound represented by the following general formula (1):

General formula (1)

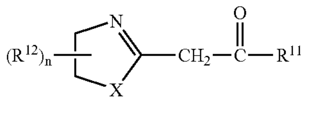

wherein X represents an oxygen atom or a sulfur atom; $R^{11}$ represents an alkyl group, an aryl group, a heterocyclic group, —$OR^{13}$ or —$NR^{14}R^{15}$; $R^{12}$ represents a substituent; $R^{13}$ represents an alkyl group, an aryl group or a heterocyclic group; $R^{14}$ and $R^{15}$ each independently represents a hydrogen atom, an alkyl group, an aryl group or a heterocyclic group; n represents an integer from 0 to 4; and when n is an integer of 2 or greater, two or more $R^{12}$s may be linked with each other to form a ring.

2. The recording material according to claim 1, wherein the diazo compound is a diazonium salt represented by the following general formula (2):

General formula (2)

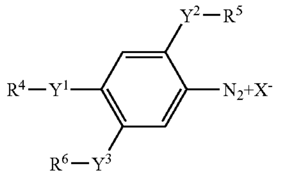

wherein $R^4$ and $R^6$ each independently represents an alkyl group, an aryl group, a heterocyclic group or an acyl group, and may be linked with each other to form a ring; $R^5$ represents an alkyl group, an aryl group, an alkylsulfonyl group, an arylsulfonyl group, an acyl group or a heterocyclic group; $Y^1$ represents an oxygen atom, a sulfur atom or an amino group; $Y^2$ represents an oxygen atom, a sulfur atom or a single bond; $Y^3$ represents an oxygen atom, a sulfur atom, or a hydrogen atom, provided that when $Y^3$ is a hydrogen atom, $R^6$ is not present; and $X^-$ represents an anion.

3. The recording material according to claim 1, wherein the diazo compound is a diazonium compound represented by the following general formula (3):

General formula (3)

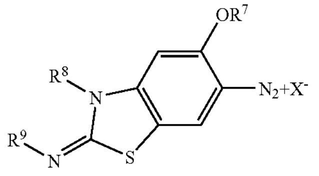

wherein $R^7$ and $R^8$ each independently represents an alkyl group or an aryl group; $R^9$ represents a hydrogen atom, an alkyl group or an aryl group; and $X^-$ represents an anion.

4. The recording material according to claim 1, wherein the diazo compound is a diazonium compound represented by the following general formula (4):

General formula (4)

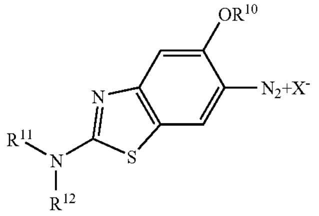

wherein $R^{10}$, $R^{11}$ and $R^{12}$ each independently represents an alkyl group or an aryl group; $R^{11}$ and $R^{12}$ be linked with each other to form a ring; and $X^-$ represents an anion.

5. The recording material according to claim 1, wherein the diazo compound is encapsuled in a microcapsule.

6. The recording material according to claim 5, wherein the microcapsule has a microcapsule wall made from at least one polymer selected from polyurethane or polyurea.

7. The recording material according to claim 1, wherein the coupler is contained in the recording layer in an amount of 0.2 to 8 moles per 1 mole of the diazo compound.

8. The recording material according to claim 1, wherein the diazo compound is contained in the recording layer in an amount of 0.02 to $3g/m^2$.

9. The recording material according to claim 1, wherein the recording layer further contains an organic base.

10. The recording material according to claim 9, wherein the organic base is used in an amount of 0.1 to 30 parts by mass per 1 part by mass of the diazo compound.

11. The recording material according to claim 1, wherein the recording layer further contains a color forming auxiliary.

12. The recording material according to claim 11, wherein the color forming auxiliary is a heat melting substance.

13. The recording material according to claim 1, wherein the recording layer further contains an antioxidant.

14. The recording material according to claim 13, wherein the antioxidant is added in an amount of 0.05 to 100 parts by mass per 1 part by mass of the diazo compound.

15. The recording material according to claim 1, wherein the recording layer further contains a free radical generating agent.

16. The recording material according to claim 1, wherein the recording layer further contains a vinyl monomer.

17. The recording material according to claim 1, wherein the recording layer is a thermal recording layer.

18. An azolinyl acetic acid derivative represented by the following general formula (1a):

General formula (1a)

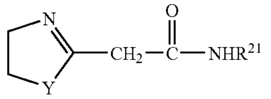

wherein Y represents an oxygen atom or a sulfur atom; and $R^{21}$ represents an alkyl group or an aryl group.

* * * * *